(12) United States Patent
Sato et al.

(10) Patent No.: US 10,515,890 B2
(45) Date of Patent: Dec. 24, 2019

(54) SEMICONDUCTOR DEVICE

(71) Applicant: Renesas Electronics Corporation, Koutou-ku, Tokyo (JP)

(72) Inventors: Yoshiaki Sato, Tokyo (JP); Shuuichi Kariyazaki, Tokyo (JP); Kazuyuki Nakagawa, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 32 days.

(21) Appl. No.: 15/817,267

(22) Filed: Nov. 19, 2017

(65) Prior Publication Data

US 2018/0182700 A1  Jun. 28, 2018

(30) Foreign Application Priority Data

Dec. 28, 2016 (JP) ................. 2016-254827

(51) Int. Cl.
*H01L 21/66* (2006.01)
*H01L 23/498* (2006.01)
(Continued)

(52) U.S. Cl.
CPC ...... *H01L 23/49838* (2013.01); *H01L 21/486* (2013.01); *H01L 21/4853* (2013.01);
(Continued)

(58) Field of Classification Search
CPC .......... H05K 1/185; H05K 1/115; H05K 1/09; H05K 3/467; H05K 3/188; H05K 3/0017; H05K 2201/10015; H01L 23/49822; H01L 21/4857; H01L 25/0657; H01L 2225/06589; H01L 2225/06582
See application file for complete search history.

(56) References Cited

U.S. PATENT DOCUMENTS 6,370,013 B1 * 4/2002 Iino ...................... H01G 4/2325
257/E23.062
2008/0211086 A1 * 9/2008 Morita ................ H01L 23/5389
257/E21.505
(Continued)

FOREIGN PATENT DOCUMENTS

JP      2015-018851 A      1/2015

OTHER PUBLICATIONS

Extended European Search Report dated Aug. 20, 2018, in European Patent Application No. 17205253.2.

*Primary Examiner* — Roy K Potter
(74) *Attorney, Agent, or Firm* — Shapiro, Gabor and Rosenberger, PLLC

(57) ABSTRACT

A semiconductor device which provides improved reliability. The semiconductor device includes: a wiring substrate having a first surface and a second surface opposite to the first surface; a chip condenser built in the wiring substrate, having a first electrode and a second electrode; a first terminal and a second terminal disposed on the first surface; and a third terminal disposed on the second surface. The semiconductor device further includes: a first conduction path for coupling the first terminal and the third terminal; a second conduction path for coupling the first terminal and the first electrode; a third conduction path for coupling the third terminal and the first electrode; and a fourth conduction path for coupling the second terminal and the first electrode.

21 Claims, 25 Drawing Sheets

(51) Int. Cl.
  H01L 23/64    (2006.01)
  H01L 23/31    (2006.01)
  H01L 23/367   (2006.01)
  H01L 21/48    (2006.01)
  H01L 21/56    (2006.01)
  H01L 25/065   (2006.01)
  H05K 1/02     (2006.01)
  H01L 23/50    (2006.01)
  H01L 23/00    (2006.01)
  H05K 1/18     (2006.01)
  H05K 3/46     (2006.01)

(52) U.S. Cl.
  CPC ........ *H01L 21/4857* (2013.01); *H01L 21/565* (2013.01); *H01L 22/32* (2013.01); *H01L 23/3157* (2013.01); *H01L 23/3675* (2013.01); *H01L 23/49822* (2013.01); *H01L 23/49894* (2013.01); *H01L 23/50* (2013.01); *H01L 23/642* (2013.01); *H01L 25/0655* (2013.01); *H05K 1/0268* (2013.01); *H01L 23/367* (2013.01); *H01L 23/49827* (2013.01); *H01L 24/13* (2013.01); *H01L 24/16* (2013.01); *H01L 24/29* (2013.01); *H01L 24/32* (2013.01); *H01L 24/33* (2013.01); *H01L 24/73* (2013.01); *H01L 2224/16227* (2013.01); *H01L 2224/16265* (2013.01); *H01L 2224/2919* (2013.01); *H01L 2224/32225* (2013.01); *H01L 2224/32245* (2013.01); *H01L 2224/33181* (2013.01); *H01L 2224/73204* (2013.01); *H01L 2224/73253* (2013.01); *H01L 2924/15311* (2013.01); *H01L 2924/19041* (2013.01); *H01L 2924/19103* (2013.01); *H05K 1/0231* (2013.01); *H05K 1/185* (2013.01); *H05K 3/4602* (2013.01); *H05K 2201/10015* (2013.01)

(56) References Cited

U.S. PATENT DOCUMENTS

| | | |
|---|---|---|
| 2014/0285213 A1 | 9/2014 | Sakurai et al. |
| 2016/0183379 A1* | 6/2016 | Song .................... H05K 1/185 174/260 |

* cited by examiner

FIG. 18

|  | Ps3 (Pd3) | Ps4 (Pd4) | Ps5 (Pd5) | CONTINUITY A(B)-(C) (D(E)-(F) | JUDGMENT |
|---|---|---|---|---|---|
| CASE 1 | ○ | ○ | ○ | OK | Pass |
| CASE 2 | ○ | ○ | × | NO | fail |
| CASE 3 | ○ | × | ○ | OK | Pass |
| CASE 4 | ○ | × | × | NO | fail |
| CASE 5 | × | ○ | ○ | OK | Pass |
| CASE 6 | × | × | ○ | NO | fail |
| CASE 7 | × | ○ | × | NO | fail |
| CASE 8 | × | × | × | NO | fail |

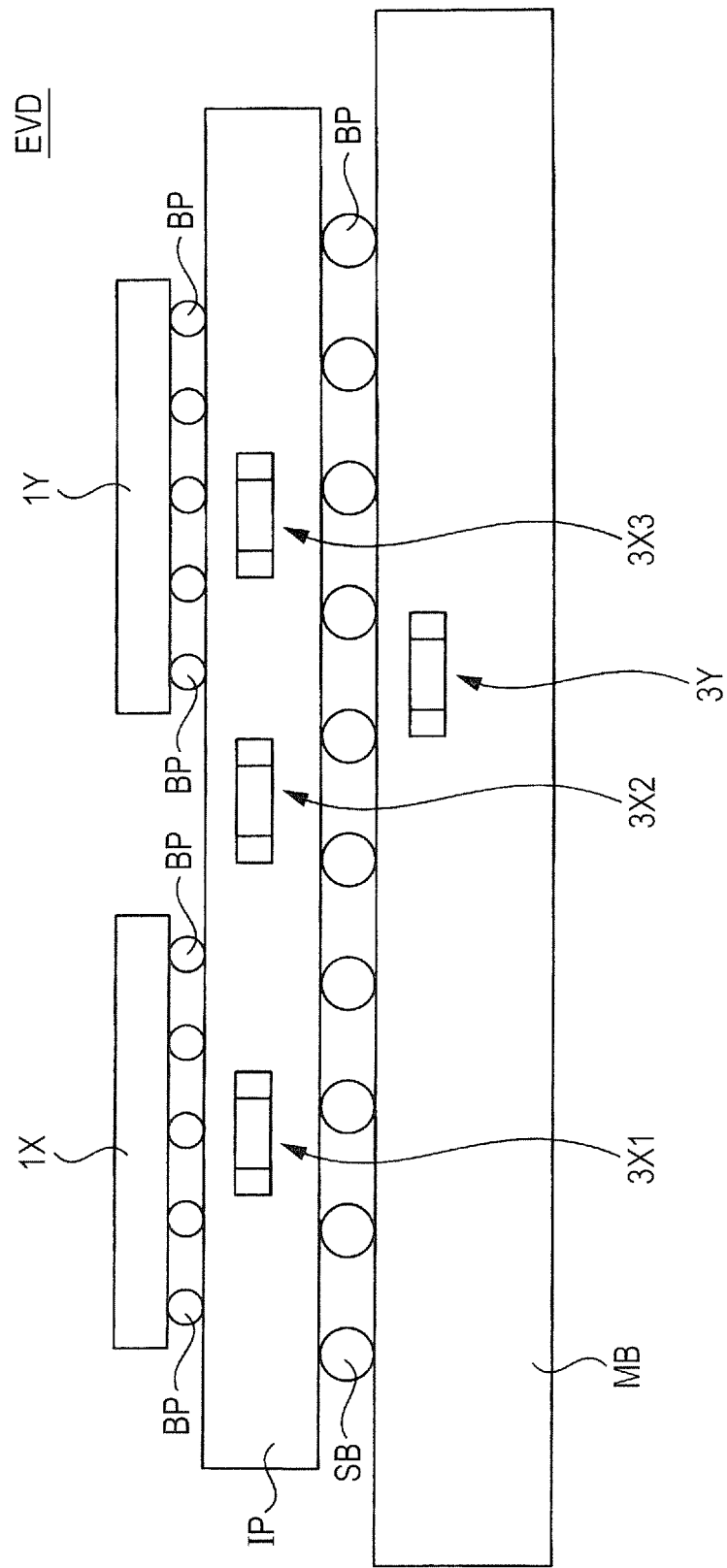

SEMICONDUCTOR DEVICE

CROSS-REFERENCE TO RELATED APPLICATIONS

The disclosure of Japanese Patent Application No. 2016-254827 filed on Dec. 28, 2016 including the specification, drawings and abstract is incorporated herein by reference in its entirety.

BACKGROUND

The present invention relates to a semiconductor device in which a semiconductor chip is mounted, for example, over a wiring substrate with a built-in chip condenser.

Japanese Unexamined Patent Application Publication No. 2015-18851 describes a semiconductor device in which a semiconductor chip is mounted over a substrate with a built-in electronic component, in which a chip capacitor is built in.

SUMMARY

In Japanese Unexamined Patent Application Publication No. 2015-18851, FIG. 8 shows a structure in which a chip capacitor 40 is built in an opening 2a of a core wiring substrate 2. As shown in FIG. 8, one coupling terminal 42 of the chip capacitor 40 is coupled to a third wiring layer 24 on the upper surface side of a substrate 1 with a built-in electronic component and a third wiring layer 24 on its lower surface side. Specifically, the third wiring layer 24 on the upper surface side is coupled to the third wiring layer 24 on the lower surface side through the one coupling terminal 42 (called "conduction path 1"). Furthermore, the third wiring layer 24 on the upper surface side is coupled to the third wiring layer 24 on the lower surface side through a through-hole plating layer 20a provided in the core wiring substrate 2 (called "conduction path 2"). In short, the third wiring layer 24 on the upper surface side and the third wiring layer 24 on the lower surface side are coupled in parallel by the conduction paths 1 and 2.

It has been found from the study by the present inventors that in the above structure, if a coupling failure occurs in the conduction path 1, it is difficult to detect the failure and the coupling reliability of the chip capacitor 40 cannot be assured. Specifically, even if a continuity test to check continuity between the third wiring layer 24 on the upper surface side and the third wiring layer 24 on the lower surface side is conducted, a coupling failure in the conduction path 1 cannot be detected because of the presence of the conduction path 2. More specifically, if there is disconnection both between the third wiring layer 24 on the upper surface side and the coupling terminal 42 and between the third wiring layer 24 on the lower surface side and the coupling terminal 42, the chip capacitor would not function, thereby causing a decline in the reliability of the semiconductor device with a semiconductor chip 60 mounted over the substrate 1 with a built-in electronic component.

One method for detecting a coupling failure in the chip capacitor 40 is to measure the value of capacitance between the third wiring layer 24 on the upper surface side and the third wiring layer 24 on the lower surface side. However, in the case of a decoupling condenser, many (for example, ten) chip capacitors (for example, ones with a capacitance value of 1 µF) are coupled in parallel between a supply voltage wiring and a reference voltage wiring and the capacitance value varies among the individual chip capacitors (for example, ±0.2 µF). Since the range of variation (±0.2 µF) in the total capacitance value (10±0.2 µF) of the many chip capacitors is larger than the capacitance value (1 µF) of each chip capacitor, it is difficult to detect a coupling failure, for example, in one chip capacitor.

Therefore, improvement in the reliability of the semiconductor device in which a semiconductor chip is mounted over a wiring substrate with a built-in chip condenser (chip capacitor as mentioned above) is demanded.

The above and further objects and novel features of the invention will more fully appear from the following detailed description in this specification and the accompanying drawings.

According to one aspect of the present invention, there is provided a semiconductor device which includes a wiring substrate having a first surface and a second surface opposite to the first surface; a semiconductor chip having a first chip electrode and a second chip electrode and being mounted over the wiring substrate; a chip condenser built in the wiring substrate, having a first electrode and a second electrode; a first terminal and a second terminal disposed on the first surface; and a third terminal disposed on the second surface. The semiconductor device further includes: a first conduction path for coupling the first terminal and the third terminal; a second conduction path for coupling the first terminal and the first electrode; a third conduction path for coupling the third terminal and the first electrode; and a fourth conduction path for coupling the second terminal and the first electrode.

According to the present invention, the reliability of the semiconductor device can be improved.

BRIEF DESCRIPTION OF THE DRAWINGS

FIG. 18 is a table for good/bad judgment at a condenser coupling test step;

FIG. 32 is a sectional view of an electronic device according to Variation 3.

DETAILED DESCRIPTION

Rules of Description in the Specification

The preferred embodiments of the present invention may be described separately in different sections as necessary or for convenience sake, but the embodiments described as such are not independent from one another unless otherwise expressly stated. Regardless of the order in which they are described, one embodiment may be, in part, a detailed form of another, or one embodiment may be, in whole or in part, a variation of another. Basically, descriptions of the same elements or things are not repeated. In the preferred embodiments, when a specific numerical value is indicated for an element, the numerical value is not essential for the element unless otherwise expressly stated or unless theoretically limited to the numerical value or unless obviously the context requires the element to be limited to the specific value.

In description of a material or composition in an embodiment of the invention, the expression "X comprising A" or "X which comprises A" does not exclude a material or composition which includes an element other than A unless otherwise expressly stated or unless obviously the context requires exclusion of another element. If the expression concerns a component, it means "X which contains A as a main component". Obviously, for example, the term "silicon member" refers to not only a member made of pure silicon but also a member made of SiGe (silicon germanium) alloy or another type of multi-component alloy containing silicon as a main component or a silicon-based member which contains another additive or the like. Similarly, the terms "gold plating," "Cu layer," and "nickel plating" refer to not only members of pure gold, Cu and nickel but also members which contain gold, Cu and nickel as main components respectively.

Also, even when a specific numerical value or quantity is indicated for an element, the numerical value or quantity of the element may be larger or smaller than the specific numerical value or quantity unless otherwise expressly stated or unless theoretically limited to the specific value or quantity or unless the context requires it to be limited to the specific value or quantity.

In all the drawings that illustrate the preferred embodiments, the same or similar elements are designated by the same or similar reference signs or numerals and basically descriptions thereof are not repeated.

Regarding the accompanying drawings, hatching or the like may be omitted even in a cross section diagram if hatching may cause the diagram to look complicated or it is easy to distinguish the area concerned from a gap or void. In connection with this, background contour lines may be omitted even for a planarly closed hole if the contour of the hole is apparent from an explanation, etc. Furthermore, even if a drawing does not show across section, hatching or a dot pattern may be added to clarify that the area concerned is not a gap or void or to show the border of the area clearly.

First Embodiment

<Semiconductor Device>

Figure 1:
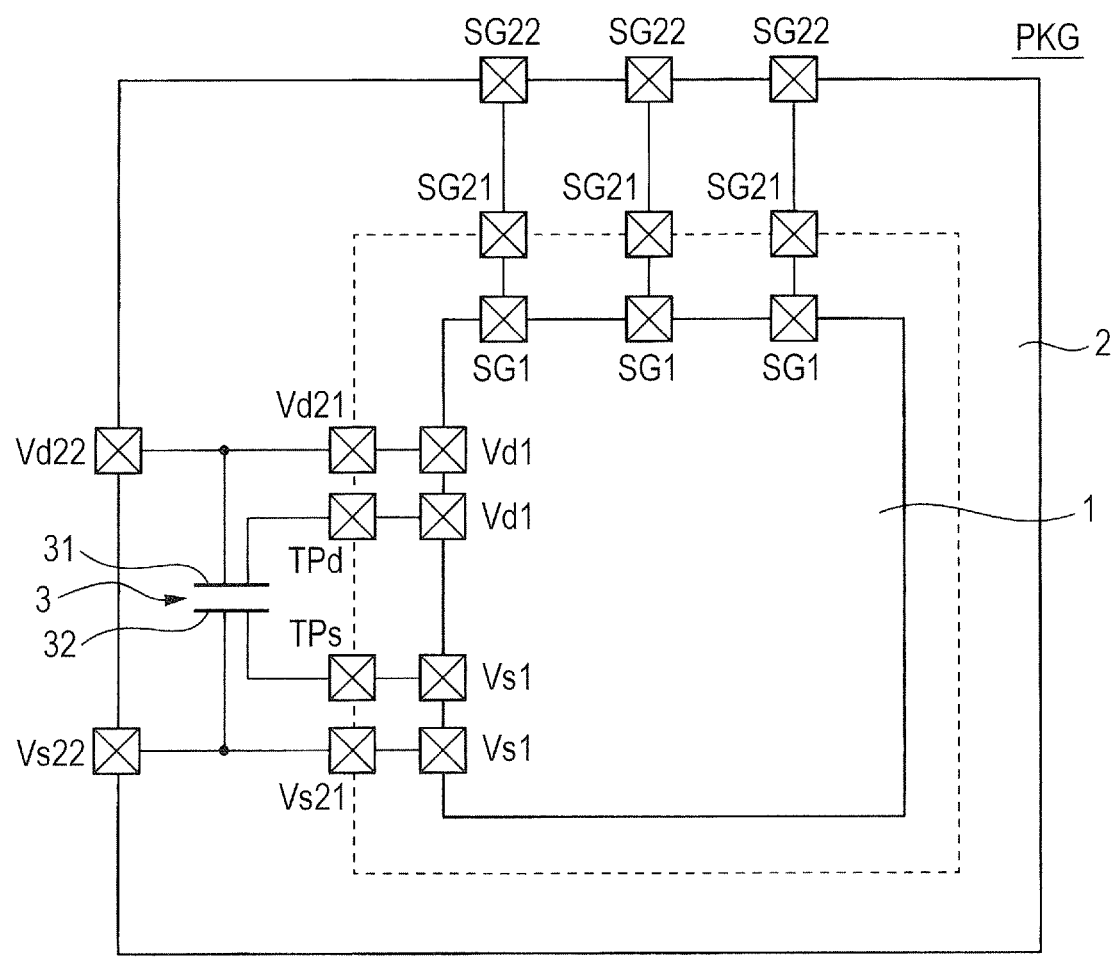
FIG. 1 illustrates an example of the circuit configuration of a semiconductor device according to an embodiment of the invention.
Figure 2:
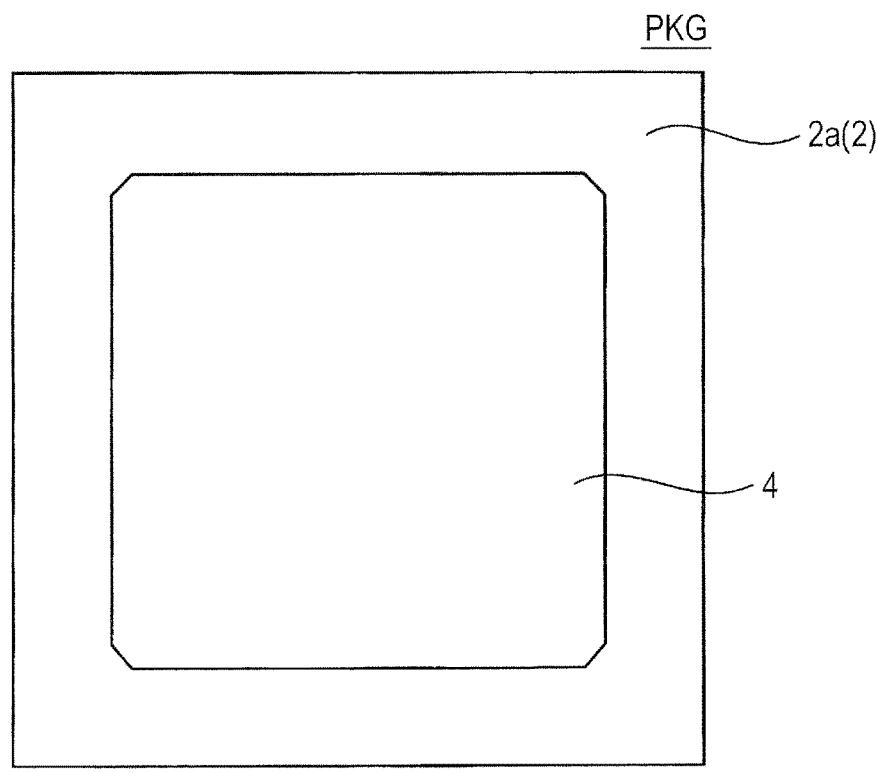
FIG. 2 is a top view of the semiconductor device according to this embodiment.
Figure 3:
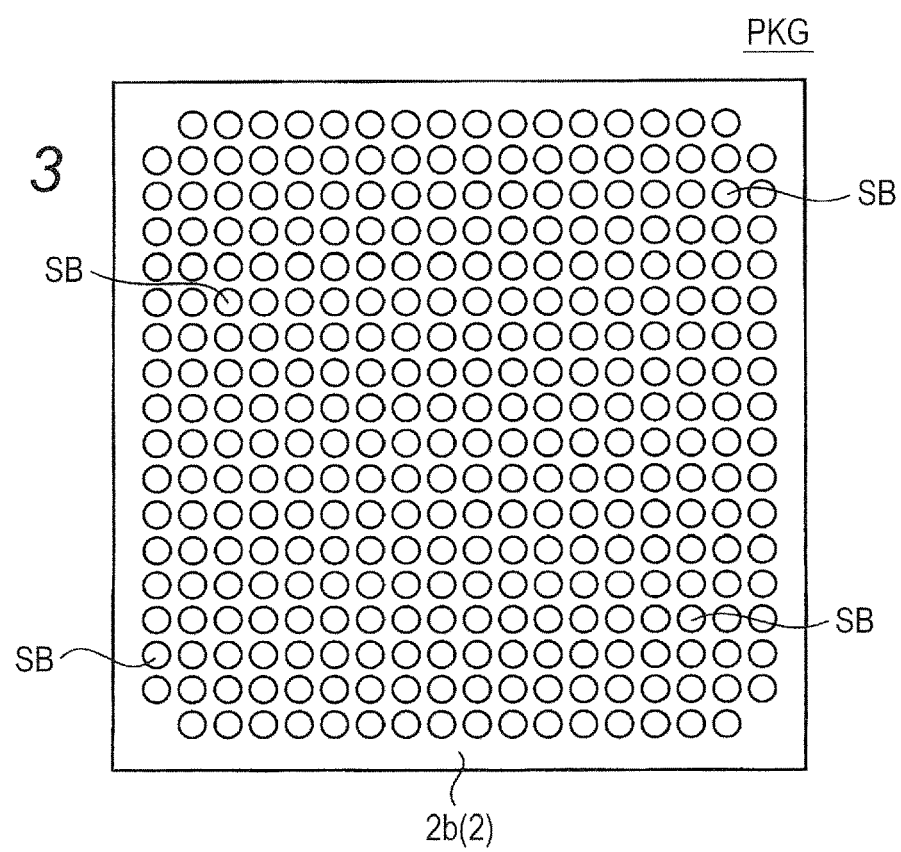
FIG. 3 is a bottom view of the semiconductor device shown in FIG. 2.
Figure 4:
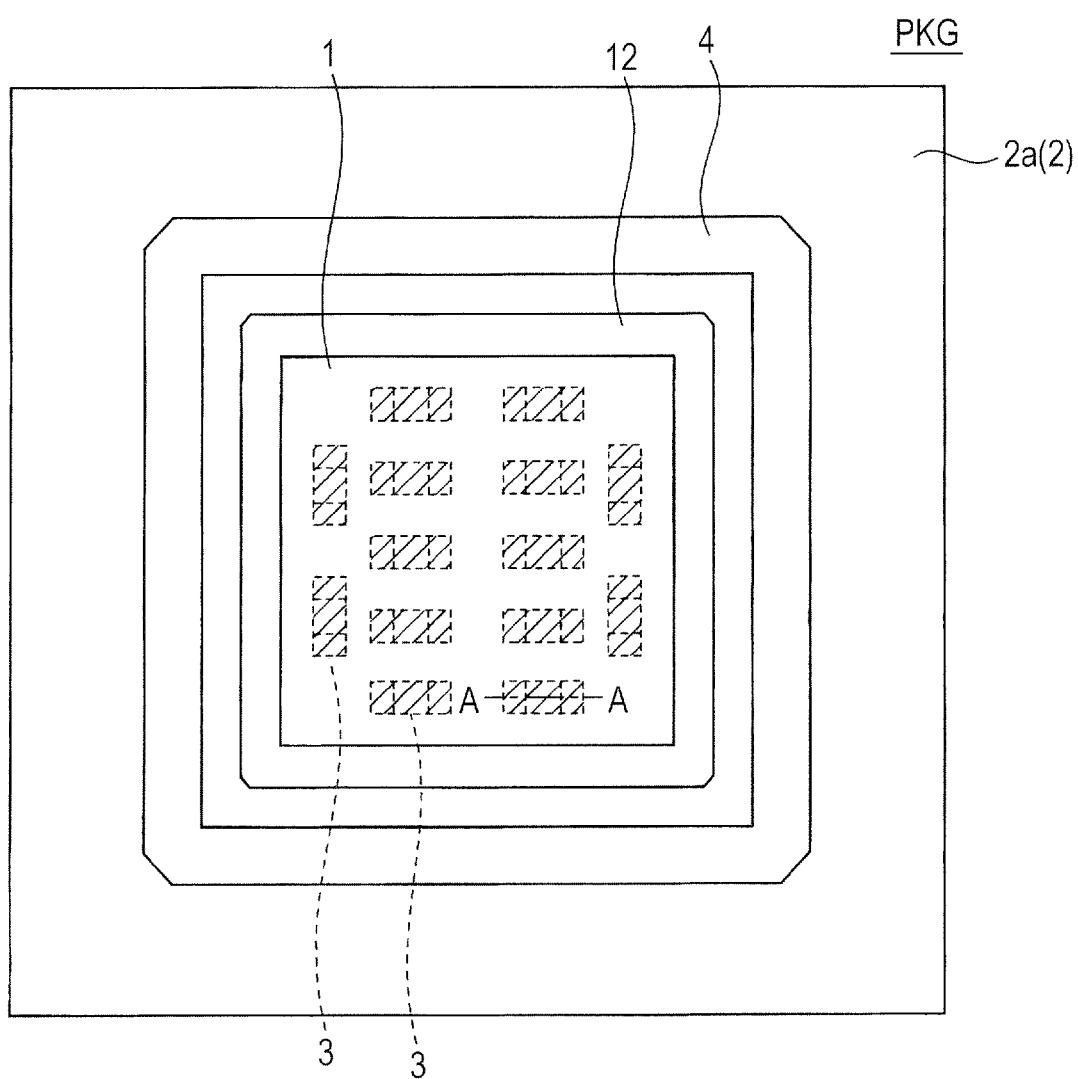
FIG. 4 is a transparent plan view of the upper surface of the semiconductor device shown in FIG. 2.
Figure 5:
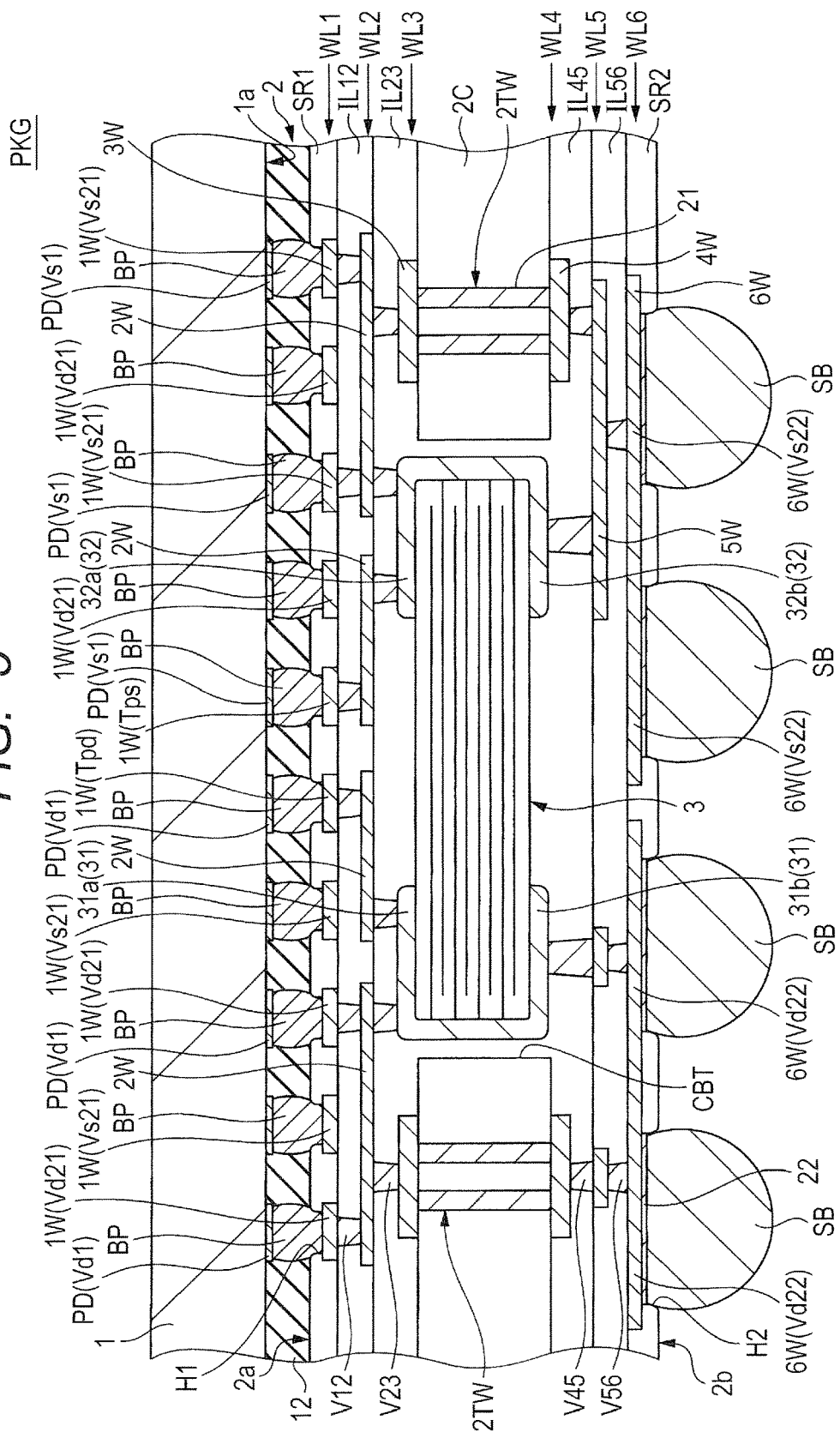
FIG. 5 is a sectional view taken along the line A-A of FIG. 4.
Figure 6:
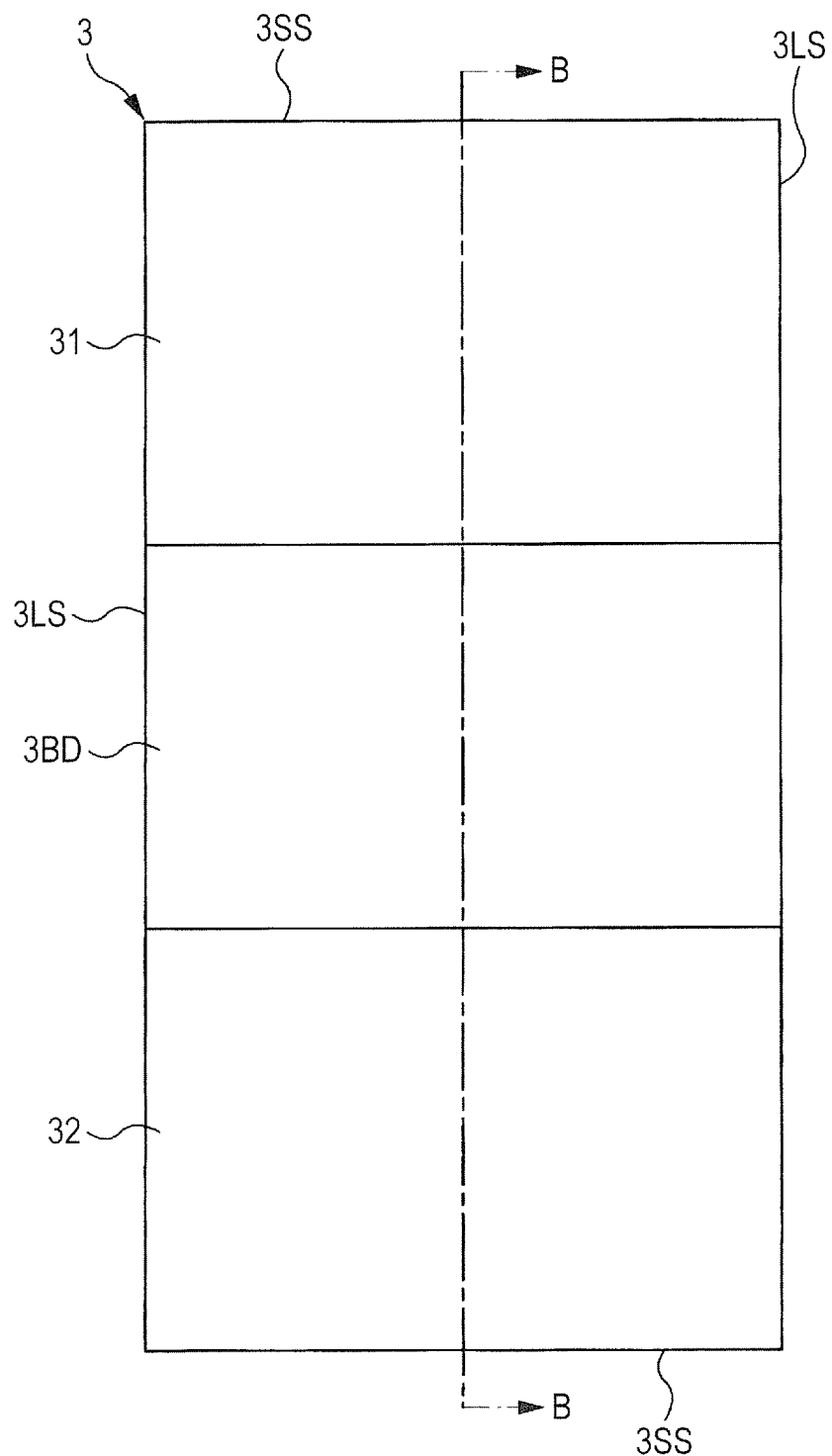
FIG. 6 is a plan view which shows one of chip condensers.
Figure 7:
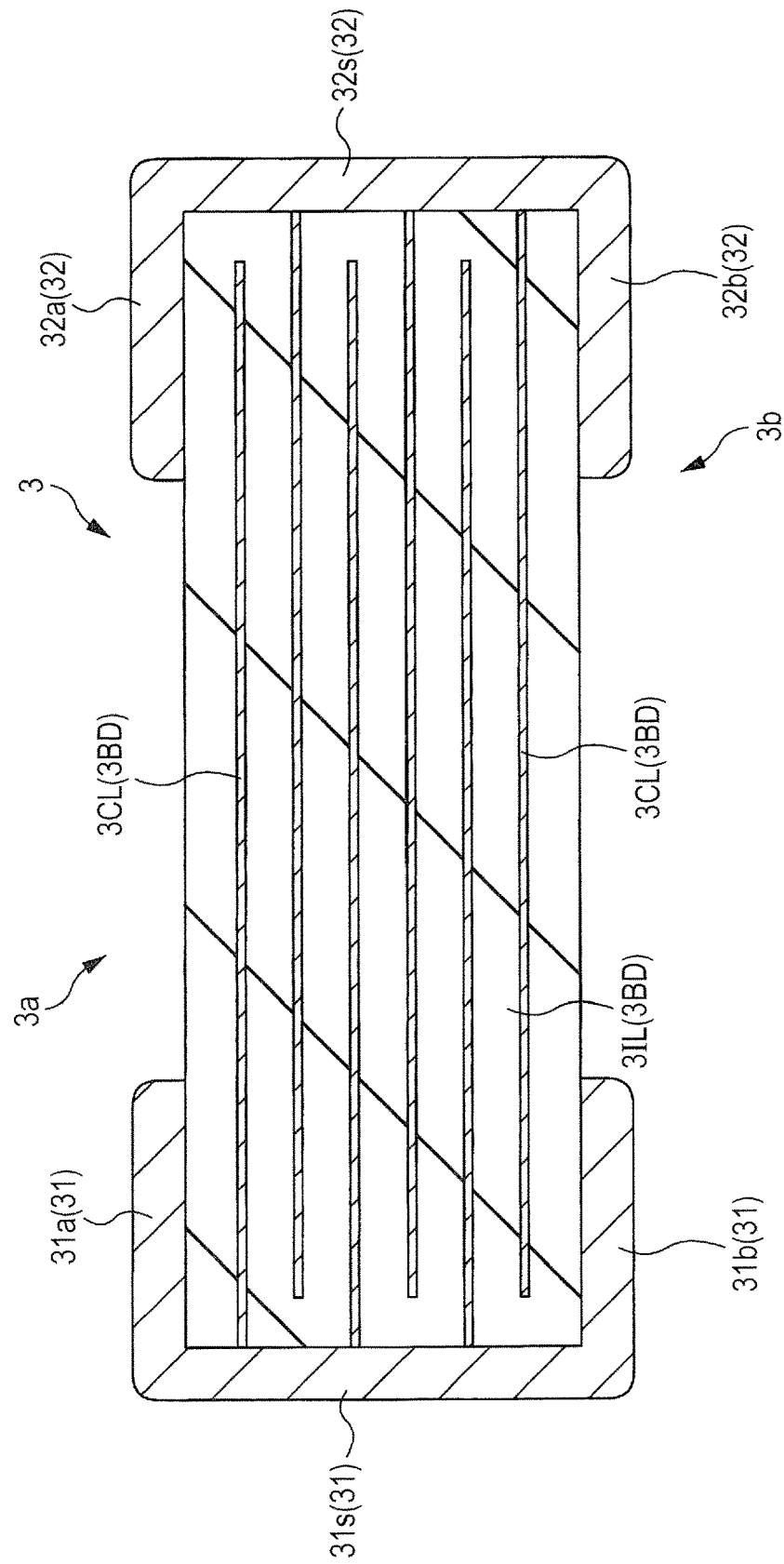
FIG. 7 is a sectional view taken along the line B-B of FIG. 6.

FIG. 1 illustrates an example of the circuit configuration of a semiconductor device according to this embodiment. FIG. 2 is a top view of the semiconductor device shown in FIG. 2. FIG. 3 is a bottom view of the semiconductor device shown in FIG. 2. FIG. 4 is a transparent plan view of the upper surface of the semiconductor device shown in FIG. 2. FIG. 5 is a sectional view taken along the line A-A of FIG. 4. FIG. 6 is a plan view which shows one of chip capacitors. FIG. 7 is a sectional view taken along the line B-B of FIG. 6.

As shown in FIG. 1, the semiconductor device PKG according to this embodiment includes a wiring substrate 2 and a semiconductor chip 1 mounted over the wiring substrate 2.

The semiconductor chip 1 includes a plurality of terminals Vd1 supplied with supply voltage (for example, Vdd=3V), terminals Vs1 supplied with reference voltage (for example, Vss=0 V), and terminals for signals SG1. The terminals Vd1, Vs1, and SG1 of the semiconductor chip 1 correspond to pad electrodes PD shown in FIG. 5.

As shown in FIG. 5, the wiring substrate 2 includes a main surface 2a and a back surface 2b, and terminals (internal terminals) Vd21, Vs21, Tpd, Tps, and SG21 are provided on the main surface 2a. Also, terminals (external terminals) Vd22, Vs22, and SG22 are provided on the back surface 2b. The terminals Vd21, Vs21, Tpd, Tps, and SG21 correspond to wirings 1W in regions exposed from an insulating film (solder resist layer) SR1 and the terminals Vd22, Vs22, and SG22 correspond to wirings 6W in regions exposed from an insulating film (solder resist layer) SR2. The terminals SG21 and SG22 are shown only in FIG. 1.

As shown in FIG. 1, the terminals Vd21, Vs21, Tpd, Tps, and SG21 are coupled to corresponding terminals Vd1, Vs1, Vd1, Vs1, and SG1 respectively. As shown in FIG. 5, the terminals Vd21, Vs21, Tpd, and Tps are coupled to the corresponding terminals Vd1, Vs1, Vd1, and Vs1 by bump electrodes BP. Furthermore, as shown in FIG. 1, the terminals Vd22, Vs22, and SG22 are coupled to the terminals Vd21, Vs21, and SG21 respectively. The path which couples the terminals Vd22 and Vd1 may be called power supply wiring, and the path which couples the terminals Vs22 and Vs1 may be called grounding wiring.

A chip condenser 3 includes electrodes 31 and 32. The electrode 31 is coupled to the terminals Vd21 and Vd22 and the electrode 32 is coupled to the terminals Vs21 and Vs22. In short, the chip condenser 3 is a decoupling condenser (or bypass condenser for power supply called "passcon" for short) which prevents fluctuations in supply voltage or noise. Furthermore, the electrode 31 is coupled to the terminal Tpd and the electrode 32 is coupled to the terminal Tps. Although FIG. 1 shows only one chip condenser 3, actually a plurality of chip condensers 3 with a circuit coupling pattern as shown in FIG. 1 are built in the wiring substrate 2 (see FIG. 4).

Figure 20:
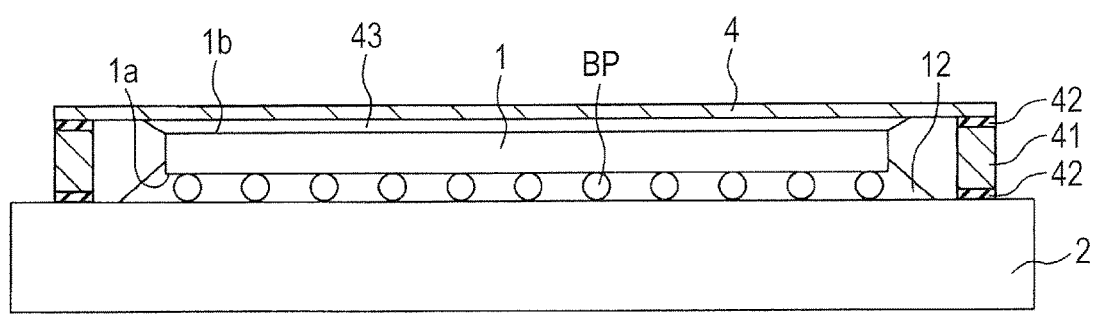
FIG. 20 is a sectional view showing a step in the process for manufacturing the semiconductor device according to this embodiment.

As shown in FIG. 2, a heat radiating plate (heat spreader, member) 4 is placed in the center of a main surface 2a of a rectangular wiring substrate in plan view. As shown in FIG. 20, the semiconductor chip 1 is coupled to the heat radiating plate 4 through an adhesion layer 43, which will be explained later. The heat radiating plate 4 has the function to dissipate the heat generated by the semiconductor chip 1 to outside of the semiconductor device PKG.

As shown in FIG. 3, a plurality of solder balls (solder members, external terminals, electrodes, external electrodes) SB are arranged in a matrix pattern (array pattern) on the back surface 2b of the wiring substrate 2. For example, if the semiconductor device PKG is mounted over a mounting board (mother board, relay board), the solder balls SB are conductive members which couple the terminals formed on the mounting board (mother board, relay board) and the terminals Vd22, Vs22, and SG22 of the semiconductor device PKG.

As shown in FIG. 4, a plurality of chip condensers 3 are built in the wiring substrate 2. In plan view, the chip condensers 3 are located in a region overlapping the semiconductor chip 1, namely under the semiconductor chip 1. In order to reduce the impedance of the power supply wiring coupled to the chip condensers 3, it is desirable to place the chip condensers 3 in the region overlapping the semiconductor chip 1 and shorten the power supply wiring; however, instead the chip condensers 3 may be located in a region not overlapping the semiconductor chip 1.

As shown in FIG. 4, an underfill resin layer (insulating layer, insulating resin) 12 is provided around the semiconductor chip 1. The underfill resin layer 12 contacts the semiconductor chip 1 and surrounds the semiconductor chip 1 continuously. As shown in FIG. 5, the space between the semiconductor chip 1 and the main surface 2a of the wiring substrate 2 is filled by the underfill resin layer 12. The underfill resin layer 12 contacts and surrounds the bump electrodes BP. The underfill resin layer between neighboring bump electrodes BP contacts the neighboring bump electrodes BP and also contacts the insulating layer SR1 on the main surface 2a of the wiring substrate 2 and the main surface 1a of the semiconductor chip 1.

As shown in FIG. 5, the wiring substrate 2 includes an insulating layer (core material, core insulating layer) 2C, insulating layers IL12, IL23, IL45, and IL56, insulating films SR1 and SR2, and wirings 1W, 2W, 3W, 4W, 5W, and 6W. The insulating layer 2C has an opening (through hole) CBT in which the chip condenser 3 is to be buried, and a through hole 21. A through-hole wiring 2TW is formed in the through hole 21 and the through-hole wiring 2TW couples a wiring 3W formed on the upper surface (semiconductor chip 1 side) of the insulating layer 2C and a wiring 4W formed on the lower surface (solder ball SB side). A plurality of wirings 3W formed on the upper surface of the insulating layer 2C are collectively called wiring layer WL3. A plurality of wirings 4W formed on the lower surface of the insulating layer 2C are collectively called wiring layer WL4. Similarly, a plurality of wirings 1W, 2W, 5W and 6W are called wiring layers WL1, WL2, WL5, and WL6 respectively. The wirings 1W are formed between the insulating layers IL12 and SR1; the wirings 2W are formed between the insulating layers IL12 and IL23; the wirings 3W are formed between the insulating layers IL23 and 2C; the wirings 4W are formed between the insulating layers 2C and IL45; the wirings 5W are formed between the insulating layers IL45 and IL56; and the wirings 6W are formed between the insulating layers IL56 and SR2.

Here, the insulating layer 2C is made of prepreg as resin-impregnated glass fiber. The wiring layers WL1, WL2, WL5, and WL6 are micro wirings made by the build-up method. The insulating layers IL12, IL23, IL45, and IL56 are, for example, made of epoxy resin or polyimide resin containing filler such as silica ($SiO_2$). The wiring layers WL1, WL2, WL3, WL4, WL5, and WL6 are each a copper (Cu)-based conductive film.

The chip condenser 3 has electrodes 31 and 32 at its both ends and is buried in an opening CBT made in the insulating layer 2C.

The upper surface of the insulating layer 2C, the wiring layer WL3, and the upper electrodes 31a and 32a of the chip condenser 3 are covered by the insulating layer IL23 and a plurality of via electrodes V23 are buried in the insulating layer IL23. A via electrode V23 electrically couples a wiring 2W formed over the insulating layer IL23 to a wiring 2W or the upper electrode 31a or 32a. The wiring layer WL2 and the insulating layer IL23 are covered by the insulating layer IL12 and a plurality of via electrodes V12 are buried in the insulating layer IL12. A via electrode V12 electrically couples a wiring 1W formed over the insulating layer IL12 to a wiring 2W. The wiring 1W and insulating layer IL12 are covered by the insulating layer SR1 and the insulating layer SR1 has a plurality of openings H1. Portions of the wirings 1W which are exposed by the openings H1 are terminals Vd21, Tpd, Tps, and Vs21. The terminals Vd21, Tpd, Tps, and Vs21 are coupled to the pad electrodes PD formed on the main surface 1a of the semiconductor chip 1 through bump electrodes BP.

Figure 9:
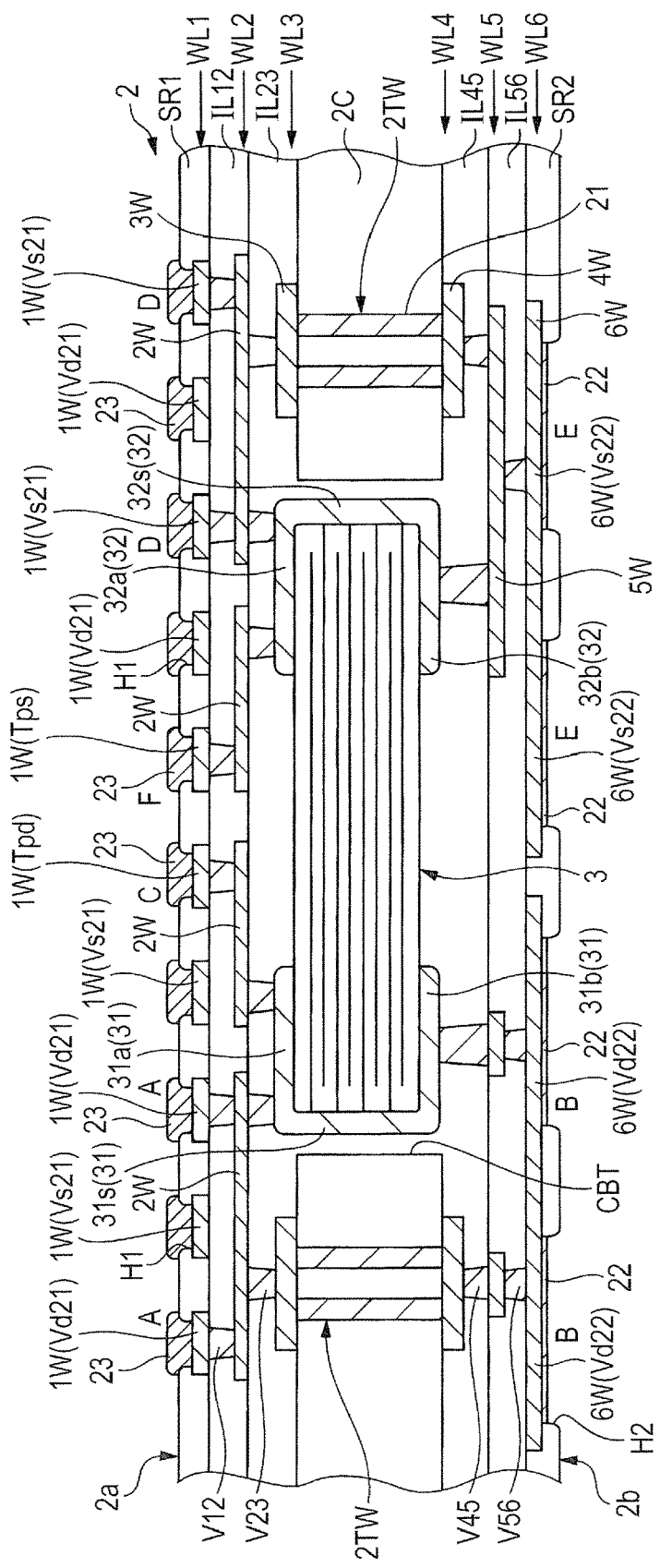
FIG. 9 is a sectional view of a wiring substrate as a work in progress in the process for manufacturing the semiconductor device according to this embodiment.
Figure 29:
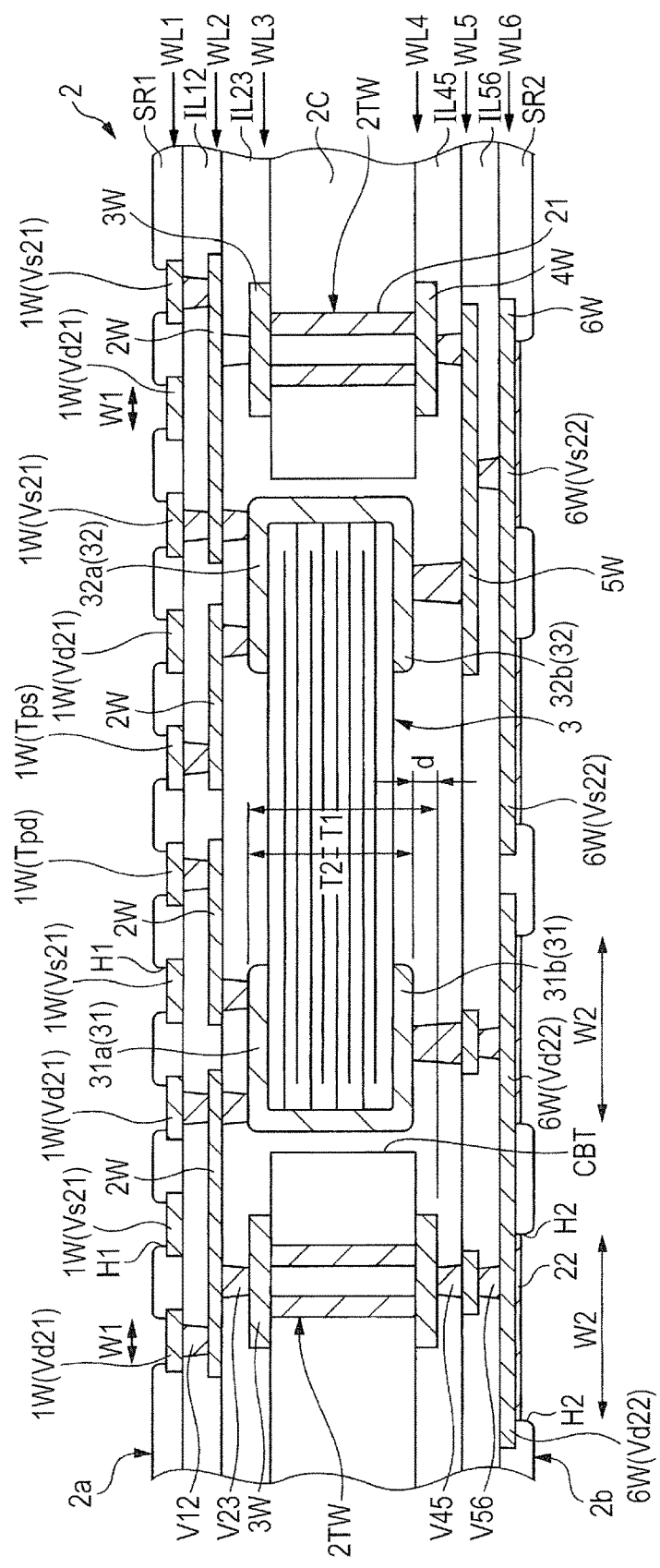
FIG. 29 is a sectional view showing a step in the process for manufacturing a wiring substrate.

The lower surface of the insulating layer 2C, the wiring layer WL4, and the lower electrodes 31b and 32b of the chip condenser 3 are covered by the insulating layer IL45 and a plurality of via electrodes V45 are buried in the insulating layer IL45. A via electrode V45 electrically couples a wiring 5W formed under the insulating layer IL45 to a wiring 4W or the lower electrode 31b or 32b. The wiring layer WL5 and the insulating layer IL45 are covered by the insulating layer IL56 and a plurality of via electrodes V56 are buried in the insulating layer IL56. A via electrode V56 electrically couples a wiring 6W formed under the insulating layer IL56 to a wiring 5W. The wiring 6W and insulating layer IL56 are covered by the insulating layer SR2 and the insulating layer SR2 has a plurality of openings H2. Portions of the wirings 6W which are exposed by openings H2 are terminals Vd22 and Vs22 and solder balls SB are coupled to the terminals Vd22 and Vs22 through a conductor layer 22. In some cases, the wiring layers WL4, WL5, and WL6, insulating layers IL45, IL56, and SR2, and solder balls SB may be described in a vertically reversed manner or upside down, in which the downward direction in FIG. 5 is taken as the upward direction. In that case, for example, the wiring layer WL5 may be described as being formed over the insulating layer IL45. Furthermore, in FIG. 5 (and FIG. 30 which will be stated later), the conductor layer 22 is, for example, an alloy layer which contains a nickel (Ni) film formed on the wiring layer WL6, the copper (Cu) of the wiring layer WL6, and the solder of a solder ball. Instead, a solder ball SB may be directly mounted on the wiring layer WL6 and if that is the case, the conductor layer 22 is an alloy layer of copper (Cu) and solder which is formed in the interface. FIGS. 9 and 29, which will be stated later, show a state before the formation of solder balls SB, so in the figures, the conductor layer 22 is a nickel (Ni) film before the formation of the above alloy layer.

Here, the electrodes 31 and 32, wiring layers WL1, WL2, WL3, WL4, WL5, and WL6, through-hole wirings 2TW, plug electrodes V12, V23, V45, and V56, bump electrodes BP, pad electrodes PD, conductor layer 22, and solder balls SB are conductive members. On the other hand, the insulating layer 2C, insulating layers IL12, IL23, IL45, and IL56, insulating layers SR1 and SR2, and underfill resin layer 12 are insulating members.

Figure 17:
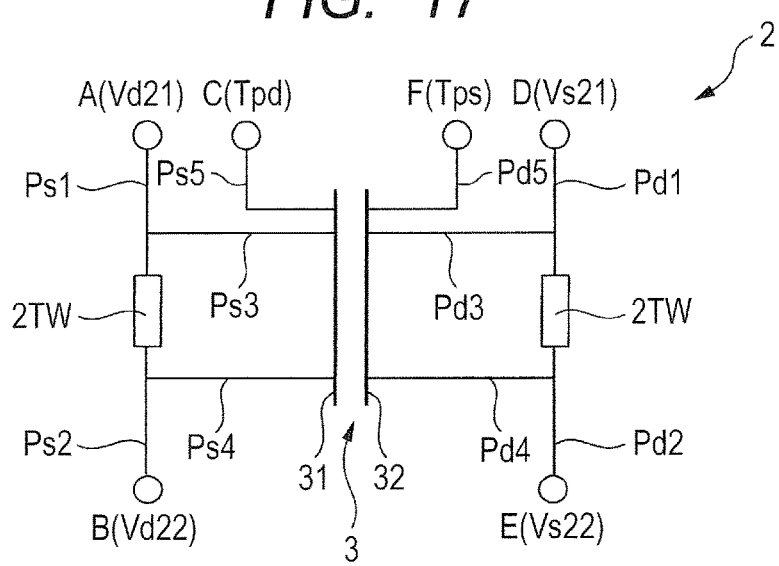
FIG. 17 is an equivalent circuit diagram of the wiring substrate shown in FIG. 9.

As shown in FIG. 5, one electrode 31 of the chip condenser 3 is coupled to the terminals Vd21 and Vd22, and the terminal Vd21 is coupled to the terminal Vd22 through a through-hole wiring 2TW. As shown in FIG. 17, which will be stated later, the terminal Vd21 (A) and terminal Vd22 (B) are coupled by a conduction path 1 including a conduction path Ps1, through-hole wiring 2TW, and conduction path Ps2 and a conduction path 2 including a conduction path Ps3, electrode 31, and conduction path Ps4. In this embodiment, since a terminal Tpd electrically coupled to the electrode 31 through a conduction path Ps5 is provided, electric coupling between the conduction path Ps3 or Ps4 and the conduction path Ps5 can be confirmed, so that the reliability of the semiconductor device PKG can be improved. The test method will be described later.

As for the other electrode 32 of the chip condensers 3, since a terminal Tps is provided, it is possible to conduct a coupling test on the chip condenser 3 in the same way as above.

Furthermore, the terminal Tpd coupled to the one electrode 31 of the chip condenser 3 and the terminal Tps coupled to the other electrode 32 are located adjacent to each other and coupled to two adjacent pad electrodes PD (namely, terminals Vd1 and Vs1) of the semiconductor chip 1 through two adjacent bump electrodes BP so that the impedance of the power supply wiring is reduced and fluctuations in the supply voltage and noise are decreased. Here, "two adjacent" terminals, bump electrodes or pad electrodes mean that there is no other terminal, bump electrode or pad electrode between them.

In addition, since the terminals Tpd and Tps to detect disconnection in the chip condenser 3 are located on the main surface 2a side of the wiring substrate 2 (namely, on the surface where the semiconductor chip 1 is mounted), the wiring substrate 2 need not be large in size. This is because the diameter (width) of a solder ball SB is larger than the diameter (width) of a bump electrode BP and there is less vacant space on the back surface of the wiring substrate 2 than on its main surface.

In addition, since the terminals Tpd and Tps are coupled to the terminals Vd1 and Vs1 of the semiconductor chip 1 through bump electrodes BP, generation of voids in the underfill resin layer 12 can be prevented. If bump electrodes BP are not provided over the terminals Tpd and Tps, there would be a region where the terminals Tpd and Tps are located but there are no bump electrodes BP. In other words, in the region where the terminals Tpd and Tps are located, the pitch (interval) between bump electrodes BP is larger than in a region where bump electrodes BP are arranged at regular pitches. If there is a region where the pitch between bump electrodes BP is different, voids would be easily generated during filling of the underfill resin layer 12.

As shown in FIG. 6, the chip condenser 3 is quadrangular (rectangular) in plan view. The chip condenser 3 has two long sides (long side faces) 3LS and two short sides (short side faces) 3SS. In the direction in which the long sides 3LS extend, the chip condenser 3 has electrodes 31 and 32 located at opposite ends. The chip condenser 3 also has a main body part 3BD between the electrodes 31 and 32. For example, as shown in FIG. 7, the main body part 3BD has a plurality of conductor layers 3CL stacked through insulating layers (dielectric layers) 3IL and each of the conductor layers 3CL is coupled to either the electrode 31 or the electrode 32. The electrode 31 has an upper electrode 31a formed on the upper surface 3a of the chip condenser 3, a lower electrode 31b formed on the lower surface 3b, and a side electrode 31s which couples the upper electrode 31a and the lower electrode 31b. Likewise, the electrode 32 has an upper electrode 32a formed on the upper surface 3a of the chip condensers 3, a lower electrode 32b formed on the lower surface 3b, and a side electrode 32s which couples the upper electrode 32a and the lower electrode 32b. Although the upper surface 3a and lower surface 3b of the chip condenser 3 are not different, for the sake of convenience the surface nearer to the semiconductor chip 1 (upper surface 3a) as shown in FIG. 5 is called the main surface 3a.

<Semiconductor Device Manufacturing Method>

Figure 8:
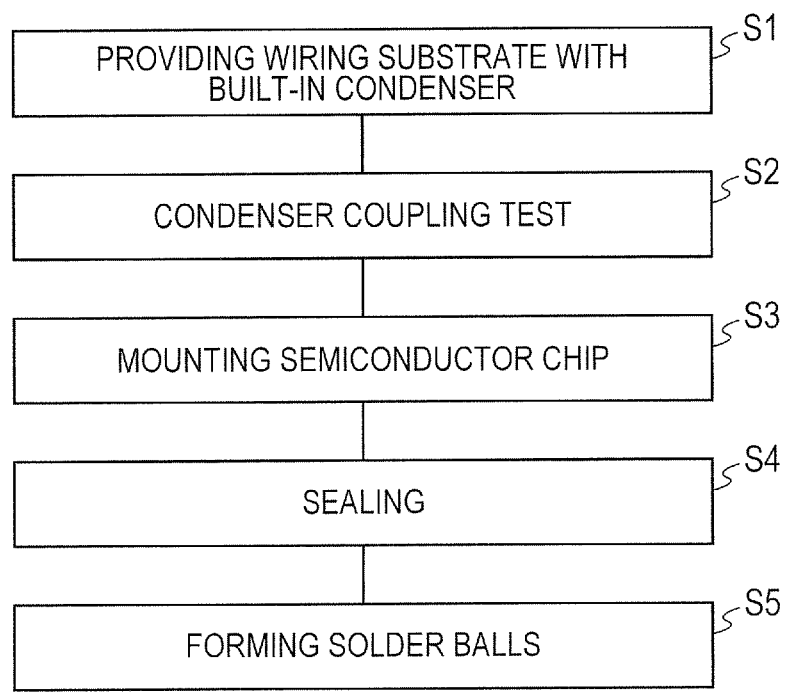
FIG. 8 is a process flow chart which shows the process for manufacturing the semiconductor device according to this embodiment.
Figure 19:
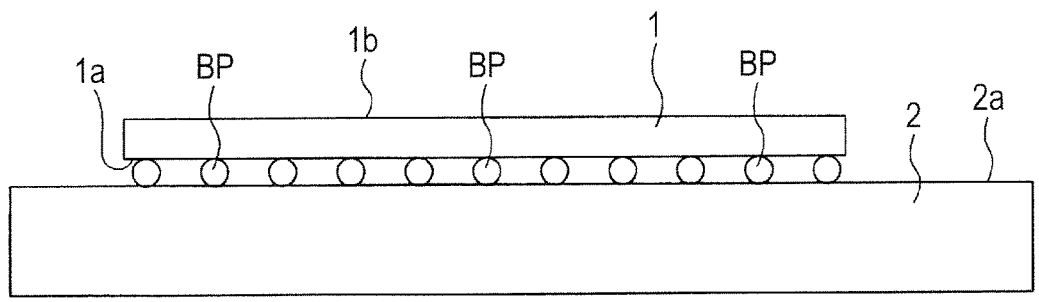
FIG. 19 is a sectional view showing a step in the process for manufacturing the semiconductor device according to this embodiment.
Figure 21:
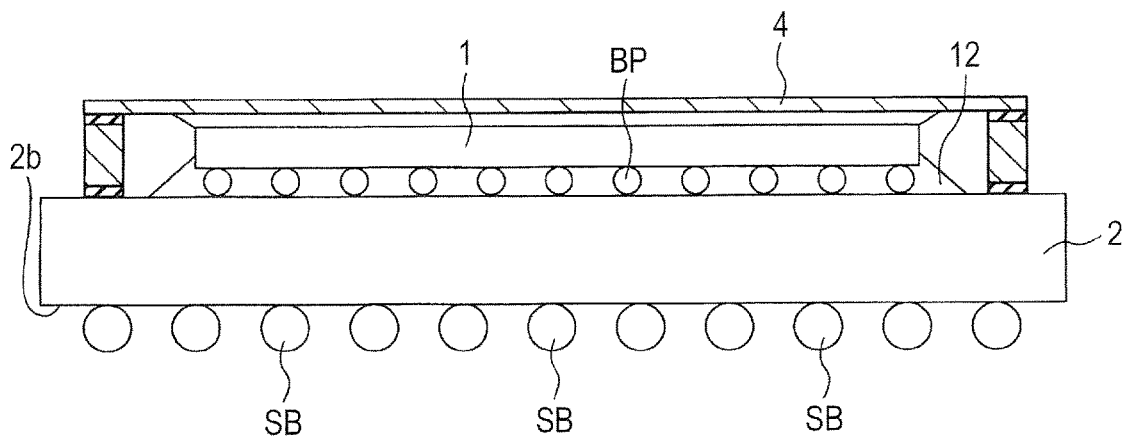
FIG. 21 is a sectional view showing a step in the process for manufacturing the semiconductor device according to this embodiment.

FIG. 8 is a process flow chart which shows the process for manufacturing the semiconductor device according to this embodiment. FIG. 9 is a sectional view of a wiring substrate as a work in progress in the process for manufacturing the semiconductor device according to this embodiment. FIGS. 10 to 16 are layout diagrams (plan views) of wiring layers of the wiring substrate shown in FIG. 9. FIG. 17 is an equivalent circuit diagram of the wiring substrate shown in FIG. 9. FIG. 18 is a table for good/bad judgement at a condenser coupling test step. FIGS. 19 to 21 are sectional views showing various steps in the process for manufacturing the semiconductor device according to this embodiment.

First, the step of "providing a wiring substrate with a built-in condenser" (Step S1) shown in FIG. 8 is carried out. Specifically, a wiring substrate 2 which contains a chip condenser 3 is provided as shown in FIG. 9. The wiring substrate 2 is the same as the one described above referring to FIG. 5, except that the semiconductor chip 1, bump electrodes BP, and solder balls SB as shown in FIG. 5 are not formed yet. However, a conductor layer 23 is formed over terminals Vd21, Vs21, Tpd, and Tps. The same kind of solder material as the material of solder balls SB which will be stated later may be used for the conductor layer 23.

As shown in FIG. 9, the terminals Tpd (C in the figure) and Vd21 (A in the figure) are coupled to the upper electrode 31a of the chip condenser 3 and the terminal Vd22 (B in the figure) is coupled to the lower electrode 31b. The terminals A and B are coupled to each other through a through-hole wiring 2TW. Specifically, the conduction path Ps1 shown in FIG. 17 includes terminal A, wiring 1W, via electrode V12, wiring 2W, via electrode V23, wiring 3W, and through-hole wiring 2TW; conduction path Ps2 includes through-hole wiring 2TW, wiring 4W, via electrode V45, wiring 5W, via electrode V56, wiring 6W, and terminal B; conduction path Ps3 includes terminal A, wiring 1W, via electrode V12, wiring 2W, via electrode V23, and electrode 31; and conduction path Ps4 includes terminal B, wiring W6, via electrode V56, wiring W5, via electrode V45, and electrode 31. The conduction path 1 includes the terminal A, conduction path Ps1, through-hole wiring 2TW, conduction path Ps2, and terminal B. The conduction path 2 includes the terminal A, conduction path Ps3, electrode 31, conduction path Ps4, and terminal B. The electrode 31 is coupled to the terminal C, making up a conduction path Ps5. The conduction path Ps5 includes the terminal C, wiring 1W, via electrode V12, wiring 2W, via electrode V23, and electrode 31.

The other electrode 32 of the chip condenser 3 has the same structure as above and its description is omitted here.

Next, the "condenser coupling test" step (Step S2) shown in FIG. 8 is carried out. In order to check the coupling between the terminal A or B and the electrode 31 of the chip condenser 3, a continuity test is conducted between the terminal A or B and the terminal C. Specifically, continuity between the conduction paths Ps3 and Ps5 or between the conduction paths Ps4 and Ps5 is tested. Both the terminals A and B need not be coupled to the electrode 31 of the chip condenser 3 and when either of these terminals is coupled to it, the chip condenser 3 functions.

In the table of FIG. 18, mark X represents that the conduction path Ps3, Ps4 or Ps5 has a coupling failure (disconnection) and mark ○ represents that it has no coupling failure.

As shown in FIG. 18, if the judgment is "Pass" (namely, good), it means that the conduction paths Ps3 and Ps5 or the conduction paths Ps4 and Ps5 are conductive (cases 1, 3, and 5). If the judgment is "fail" (namely, defective), it means that the conduction paths Ps3 and Ps5 or the conduction paths Ps4 and Ps5 are not conductive (cases 2, 4, 6, 7, and 8). If the conduction path Ps5 has a coupling failure (disconnection) (cases 2, 4, 7, and 8), the judgment is "fail" (defective) even when the conduction path Ps3 or Ps4 is conductive.

The same coupling test as above is also conducted on the electrode 32 of the chip condenser 3. A coupling test can be conducted on both the electrodes 31 and 32 simultaneously. Also, a coupling test can be conducted on another chip condenser 3 simultaneously. Since a coupling test can be conducted with a probe needle in contact with the terminals A and C only on the main surface of the wiring substrate 2, it is desirable to test the continuity between the terminals A and C.

Next, the step of "mounting a semiconductor chip" (Step S3) shown in FIG. 8 is carried out.

As shown in FIG. 19, a semiconductor chip 1 is mounted over a wiring substrate 2 which has been judged as good at the above coupling test and the semiconductor chip 1 and the wiring substrate 2 are coupled by a plurality of bump electrodes BP. For example, lead-free solder may be used for the bump electrodes BP. Also, an underlying metal film (laminated film including metals such as titanium (Ti), copper (Cu), and nickel (Ni)) may be provided between a bump electrode BP and a pad electrode PD (see FIG. 5).

Next, the "sealing" step (Step S4) shown in FIG. 8 is carried out.

First, as shown in FIG. 20, an underfill resin layer 12 is buried in a manner to fill the space between the wiring substrate 2 and the semiconductor chip 1. In the above space, the underfill resin layer 12 extends continuously from the main surface 2a of the wiring substrate 2 to the main surface 1a of the semiconductor chip 1 and contacts the sidewalls of the bump electrodes BP and entirely covers the sidewalls, as shown in FIG. 5. The stress generated at the electric coupling parts between the semiconductor chip 1 and the wiring substrate 2 can be reduced by covering the junctions between the bump electrodes BP and the terminals Vd21, Vs21, Tpd, and Tps and the junctions between the bump electrodes BP and the pad electrodes PD with the underfill resin 12 in this way. Furthermore, the stress generated at the junctions between the pad electrodes PD of the semiconductor chip 1 and the bump electrodes BP can be reduced. The underfill resin layer 12 is, for example, an insulating resin film of epoxy resin or the like. The underfill resin layer 12 extends beyond the main surface of the semiconductor chip 1 and spreads to the side faces of the semiconductor chip 1. It partially covers the side faces.

As shown in FIG. 20, a support frame (stiffener ring) 41 for supporting a heat radiating plate 4 is fixed around the semiconductor chip 1. The heat radiating plate 4 is adhesively fixed to the back surface 1b of the semiconductor chip 1 and the support frame 41 through adhesion layers 43 and 42. Warpage or deformation of the wiring substrate 2 can be suppressed by fixing the metal support frame 42 around the semiconductor chip 1, which is preferable from the viewpoint of improvement in mounting reliability. In addition, since the heat radiating plate 4 is adhesively fixed to the support frame 41 surrounding the semiconductor chip 1, the plane area of the heat radiating plate 4 can be increased. It is not always necessary to provide the heat radiating plate 4 and the support frame 41.

Next, the step of "forming solder balls" (Step S5) shown in FIG. 8 is carried out.

As shown in FIG. 21, a plurality of solder balls SB are formed on the back surface 2b of the wiring substrate 2. As shown in FIG. 5, a solder ball SB is coupled through the conductor layer 22 to a wiring 6W in an exposed region from an opening H2 made in the insulating layer SR2. The solder ball SB is a solder member made of lead (Pb)-containing Sn—Pb or lead-free solder which contains substantially no Pb and is so-called lead-free solder. An example of lead-free solder is solder containing only tin (Sn), tin-bismuth (Sn—Bi), tin-copper-silver (Sn—Cu—Ag), tin-copper (Sn—Cu), or the like.

Next, layouts of wiring layers WL1 to WL6 which configure the wiring substrate 2 will be explained referring to FIGS. 10 to 16. FIGS. 10 to 16 are fragmentary views of the wiring layers WL1 to WL6 respectively and show layouts of the chip condenser 3 and the area around it.

Figure 10:
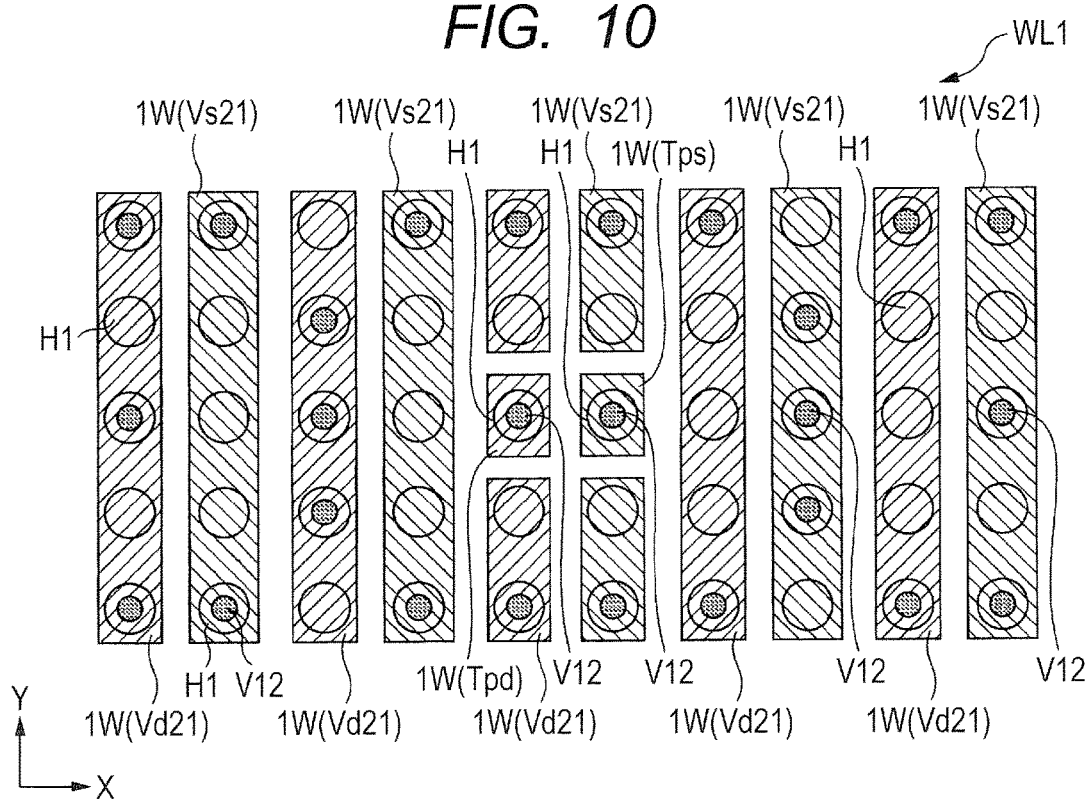
FIG. 10 is a layout diagram (plan view) of a wiring layer of the wiring substrate shown in FIG. 9.

First, FIG. 10 is the layout of the wiring layer WL1. Wirings for supply voltage 1W (Vd21) extending in the Y direction and wirings 1W for reference voltage (Vs21) are arranged alternately in the X direction. A plurality of openings H1 (marked ○) are disposed over the wirings 1W (Vd21) and wirings 1W (Vs21) and as shown in FIG. 5, bump electrodes BP are coupled to the openings H1. Since the wirings for supply voltage 1W (Vd21) and the wirings for reference voltage 1W (Vs21) are alternately and evenly arranged, the supply voltage and reference voltage can be uniformly supplied to the semiconductor chip 1. A plurality of openings H1 are arranged over each wiring for supply voltage 1W (Vd21) at regular pitches P1 in the Y direction. Also, a plurality of openings H1 are arranged over each wiring for reference voltage 1W (Vs21) at regular pitches P1 in the Y direction. The openings H1 over the wirings for supply voltage 1W (Vd21) and the openings H1 over the wirings for reference voltage 1W (Vs21) are located in the same positions in the X direction. In other words, an opening H1 over a wiring for reference voltage 1W (Vs21) is located adjacent to an opening H1 over a wiring for supply voltage 1W (Vd21) in the X direction.

Alternatively, the openings H1 over the wirings 1W (Vs21) may be shifted with respect to the openings H1 over the wirings 1W (Vd21) by half pitch (P1×½) in the X direction.

In the center of FIG. 10, a wiring 1W for terminal Tpd and a wiring for terminal Tps are located and the wiring 1W for terminal Tpd and the wiring 1W for terminal Tps are isolated from the wirings for supply voltage 1W (Vd21) and the wirings for reference voltage 1W (Vs21). The wiring 1W for terminal Tpd and the wiring 1W for terminal Tps are adjacent to each other and no wiring is present between them.

Figure 11:
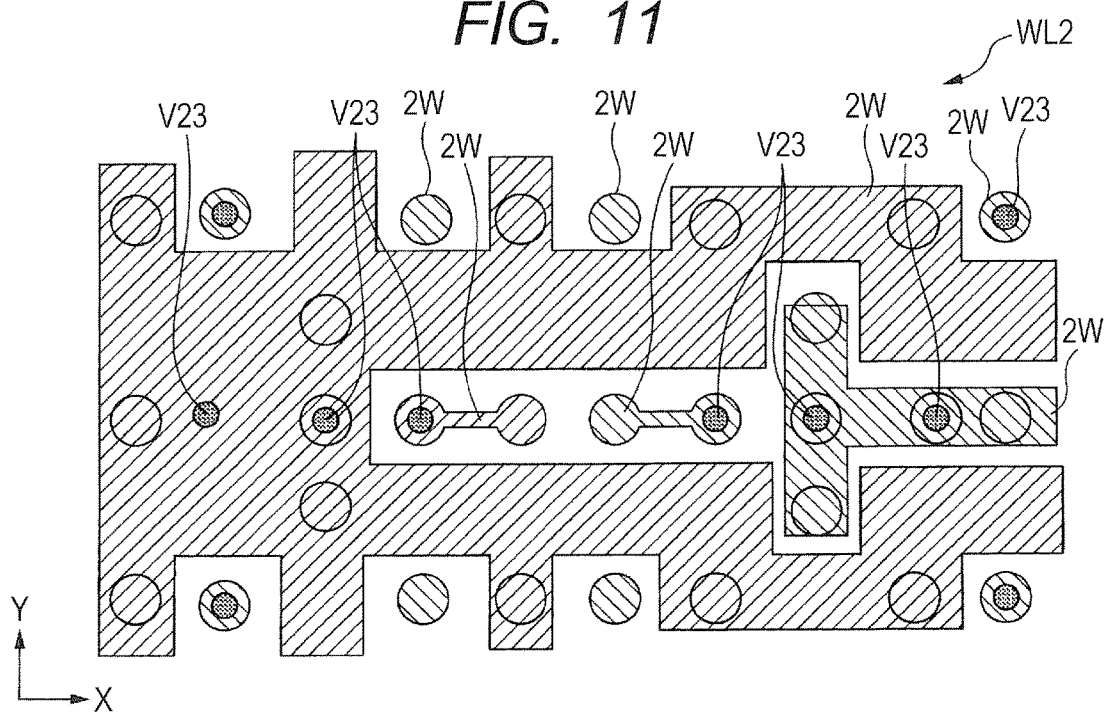
FIG. 11 is a layout diagram (plan view) of a wiring layer of the wiring substrate shown in FIG. 9.

FIG. 11 shows the layout of the wiring layer WL2. The wiring layer WL2 is mainly a plane for supply voltage. Two wirings like dog bones 2W are located in the center of FIG. 11 and wirings 2W for supply voltage are located in a manner to surround the dog bone-like wirings 2W. The wiring 1W for terminal Tpd and the wiring 1W for Tps as shown in FIG. 10 are coupled to the dog bone-like wirings 2W through via electrodes V12.

Figure 12:
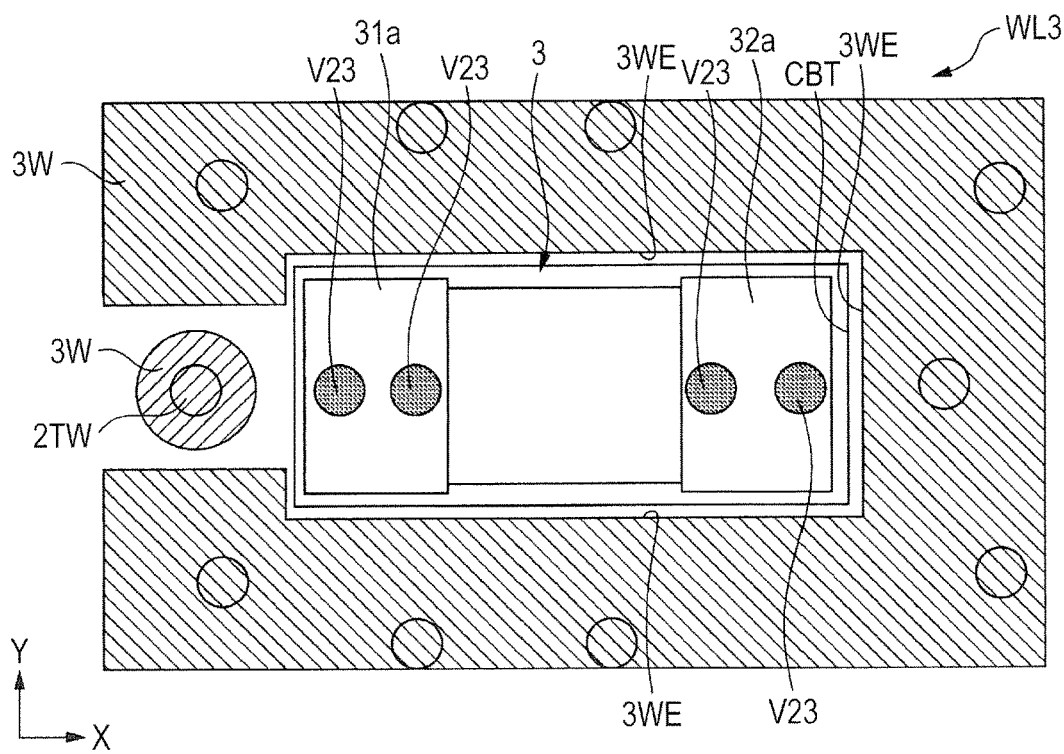
FIG. 12 is a layout diagram (plan view) of a wiring layer of the wiring substrate shown in FIG. 9.

FIG. 12 shows the layout of the wiring layer WL3. The wiring layer WL3 is mainly a plane for reference voltage. A rectangular opening CBT for placement of the chip condenser 3 is located in the center of FIG. 12 and a wiring 3W is located around the opening CBT. The wiring 3W for reference voltage has a shape which surrounds three sides of the rectangular opening CBT and the edge 3WE of the wiring 3W along the three sides is more away from the chip condenser 3 than the opening CBT. On the other side of the opening CBT, a wiring 3W for supply voltage which is coupled to a through-hole wiring 2TW is located away from the wiring 3W for reference voltage. The wiring 3W for supply voltage coupled to the through-hole wiring 2TW is also located away from the opening CBT. In short, the opening CBT is surrounded by the wiring 3W for reference voltage and the wiring 3W for supply voltage coupled to the through-hole wiring 2TW. Here, the expression "surrounded" implies that there may be a gap (distance) between a wiring 3W for supply voltage and a wiring 3W for reference voltage as shown in FIG. 12 (or FIG. 13). As shown in FIG. 5, the wiring 3W for reference voltage and the edge of the wiring 3W for supply voltage coupled to the through-hole wiring 2TW are retracted from the opening CBT toward the direction opposite to the chip condenser 3. In short, the upper surface of the insulating layer 2C is exposed on the wiring 3W for reference voltage and the opening CBT side of the wiring 3W for supply voltage coupled to the through-hole wiring 2TW, and no wiring 3W is present in that area.

The upper electrode 31a of the chip condenser 3 is coupled to two via electrodes V23: one (right) via electrode V23 is coupled to a dog bone-like wiring 2W shown in FIG. 11 and the other (left) one is coupled to a wiring 2W for supply voltage. The upper electrode 32a is coupled to two via electrodes V23: one (left) via electrode V23 is coupled to a dog bone-like wiring 2W shown in FIG. 11 and the other (right) one is coupled to a T-shaped wiring 2W for reference voltage. The two via electrodes V23 coupled to the upper electrode 31a are arranged in the X direction (direction in which the long side 3LS in FIG. 6 extends) and in parallel to the long side 3LS in FIG. 6. The two via electrodes V23 coupled to the upper electrode 32a are arranged in the same way as above.

Figure 13:
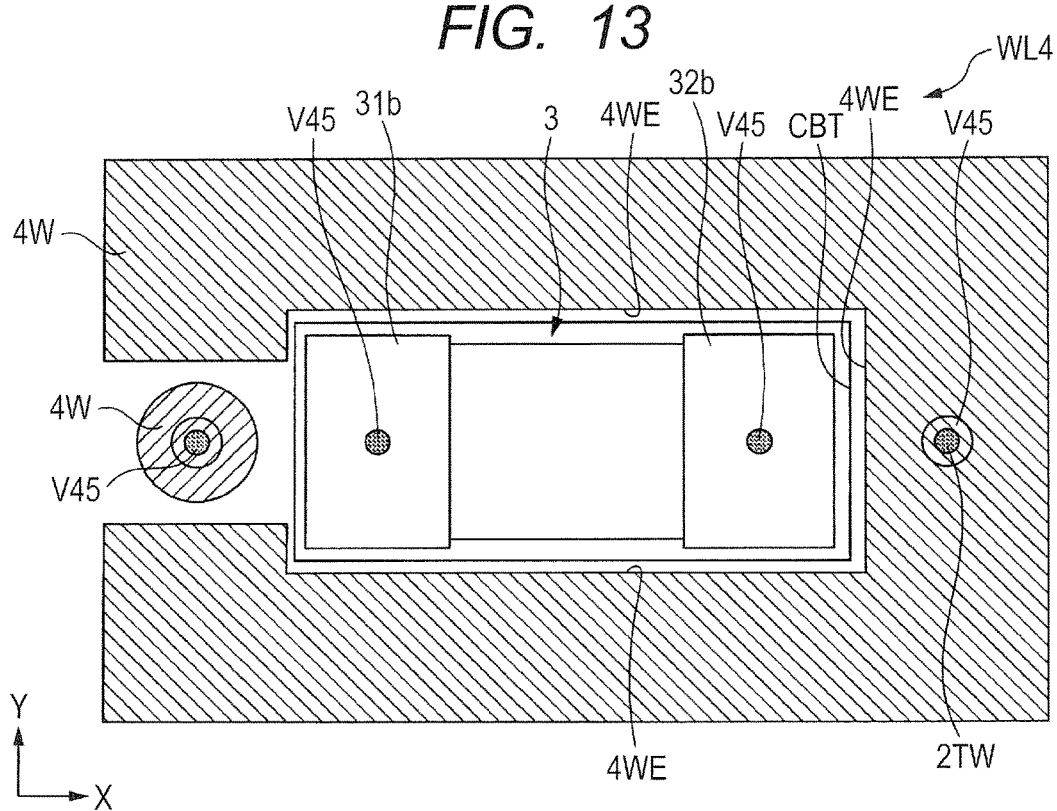
FIG. 13 is a layout diagram (plan view) of a wiring layer of the wiring substrate shown in FIG. 9.

FIG. 13 shows the layout of the wiring layer WL4. The wiring layer WL4 is mainly a plane for reference voltage. The wiring layer WL4 has the same layout as the wiring layer WL3 and description of its layout is omitted here.

Figure 14:
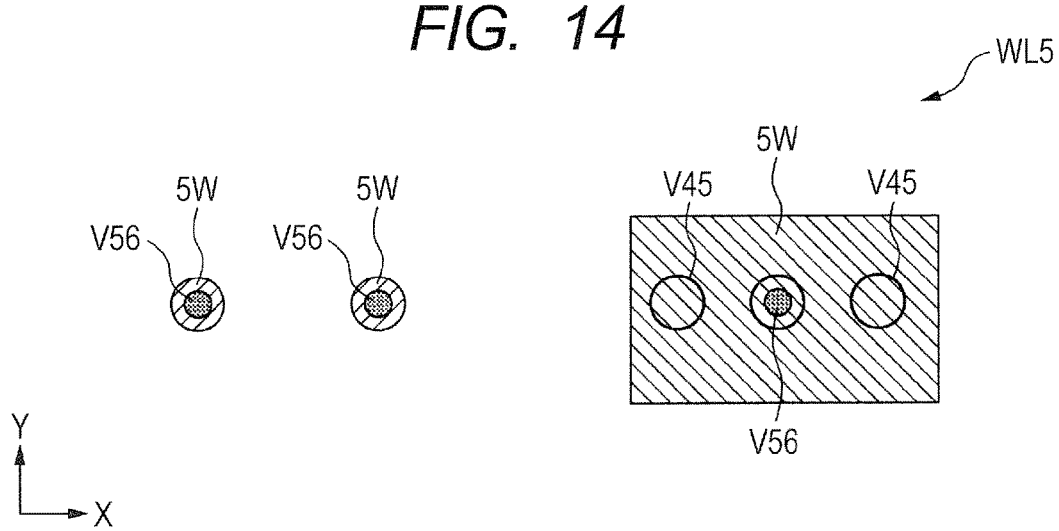
FIG. 14 is a layout diagram (plan view) of a wiring layer of the wiring substrate shown in FIG. 9.
Figure 15:
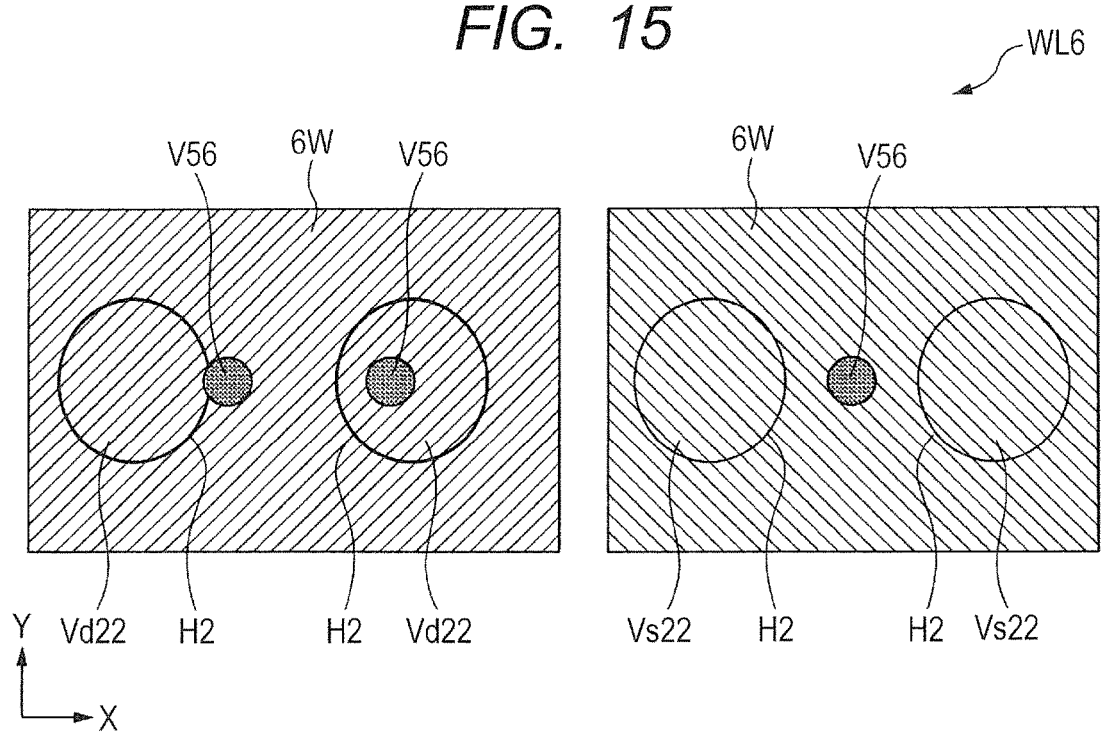
FIG. 15 is a layout diagram (plan view) of a wiring layer of the wiring substrate shown in FIG. 9.

FIG. 14 shows the layout of the wiring layer WL5 and FIG. 15 shows the layout of the wiring layer WL6. As shown in FIG. 15, the wiring layer WL6 includes a wiring 6W for terminal Vd22 and a wiring 6W for terminal Vs22. The lower electrode 31b of the chip condenser 3 shown in FIG. 13 is coupled to the wiring 6W for terminal Vd22 through the via electrode V45 and the wiring 5W and via electrode V56 shown in FIG. 14. The wiring 6W for terminal Vd22 has two openings H2 and the exposed areas from these openings H2 are terminals Vd22 to which solder balls SB shown in FIG. 5 are coupled. The wiring 6W for terminal Vs22 has two openings H2 and the exposed areas from these openings H2 are terminals Vs22 to which solder balls SB shown in FIG. 5 are coupled.

Figure 16:
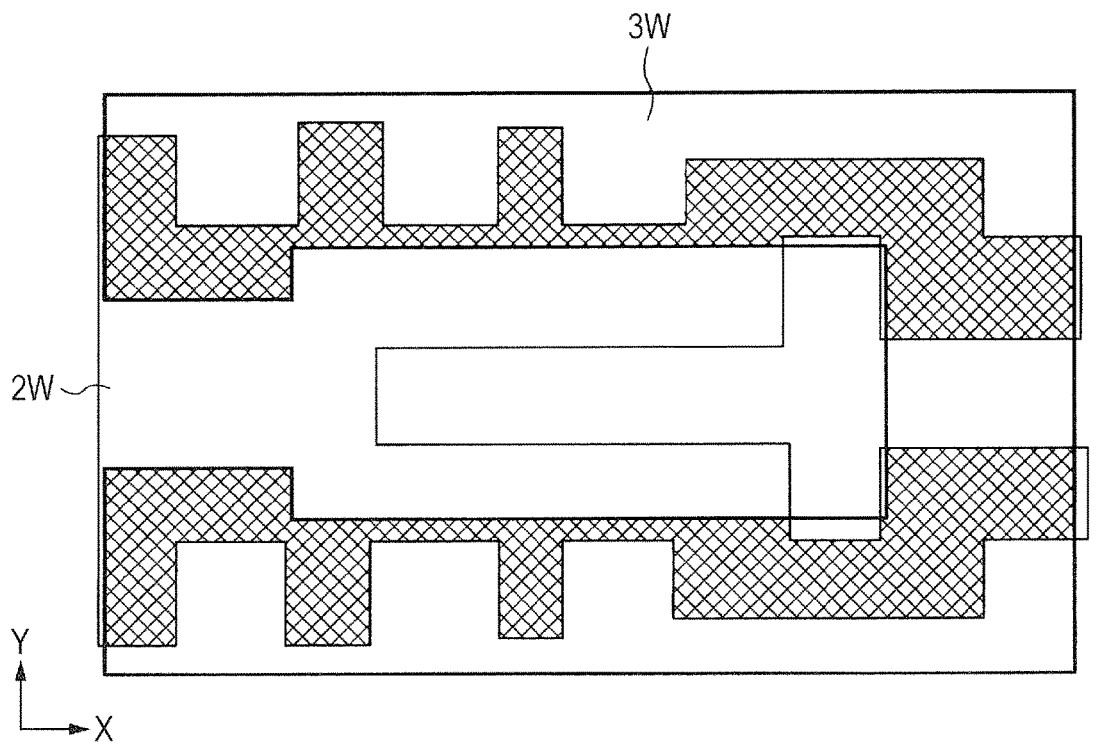
FIG. 16 is a layout diagram (plan view) of a wiring layer of the wiring substrate shown in FIG. 9.

FIG. 16 shows a wiring 2W configuring a plane for supply voltage and a wiring 3W configuring a plane for reference voltage. In FIG. 16, the area where these wirings overlap is hatched. Since there is a wide area where the wiring 2W for supply voltage and the wiring 3W for reference voltage overlap with the insulating layer IL23 between them as shown in FIG. 5, the impedance of the power supply wiring can be reduced.

As mentioned above, in the semiconductor device manufacturing method, the reliability of the semiconductor device is improved by conducting a condenser coupling test. Furthermore, since the built-in chip condenser 3 is coupled without a disconnection, the performance of the semiconductor device is improved.

<Method for Manufacturing a Wiring Substrate>

Figure 22:
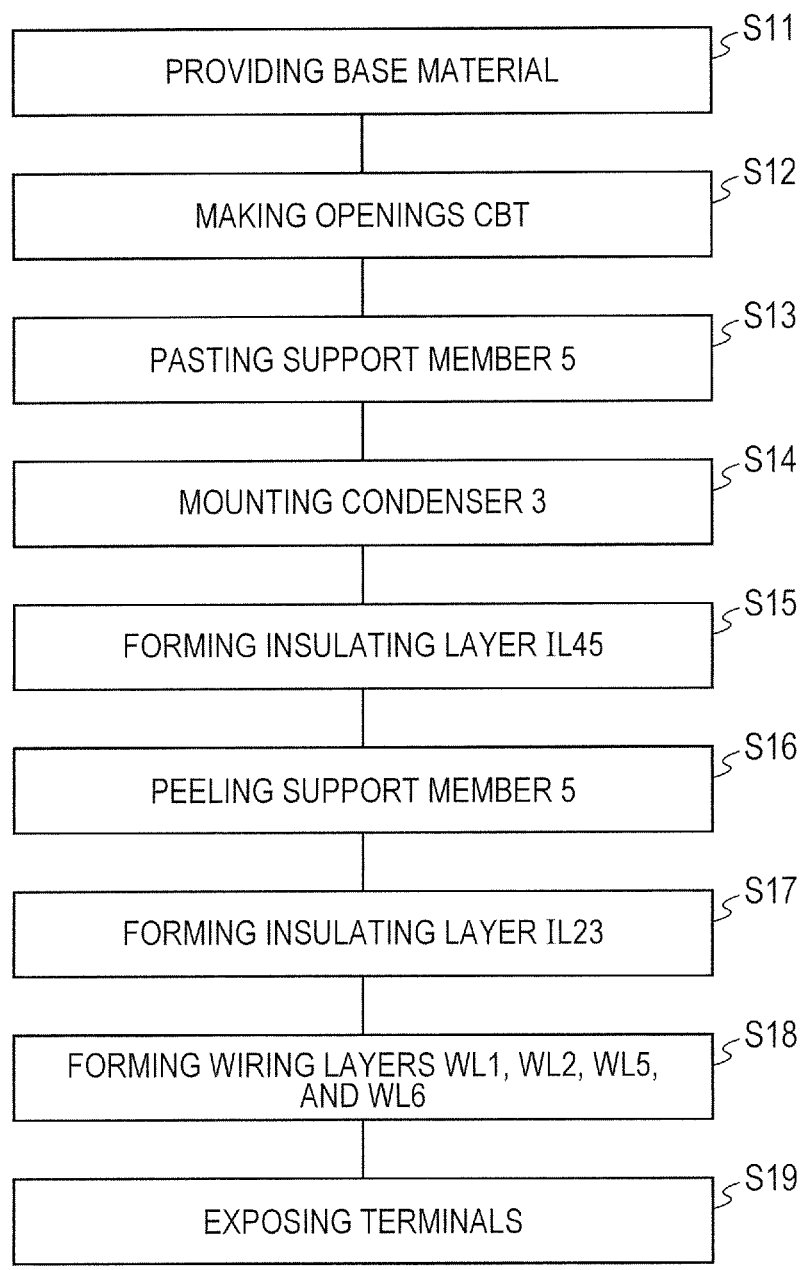
FIG. 22 is a process flowchart which shows the process for manufacturing a wiring substrate according to this embodiment.

Next, the method for manufacturing a wiring substrate with a built-in chip condenser will be described. FIG. 22 is a process flowchart which shows the process for manufacturing a wiring substrate according to this embodiment. FIGS. 23 to 29 are sectional views which show various steps in the process for manufacturing a wiring substrate.

Figure 23:
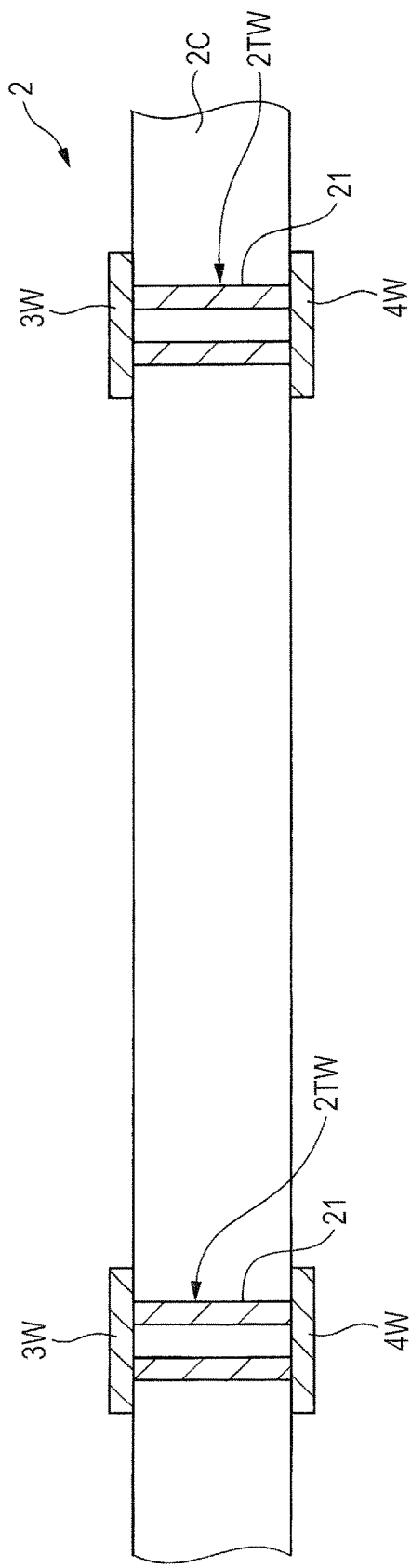
FIG. 23 is a sectional view showing a step in the process for manufacturing a wiring substrate.

First, the step of "providing a base material" (Step S11) shown in FIG. 22 is carried out. As shown in FIG. 23, an insulating layer 2C of resin-impregnated glass fiber is provided. The insulating layer 2C has through holes 21 in its thickness direction and a through-hole wiring 2TW is formed in each through hole 21. A wiring 3W is formed on the upper surface (upside in FIG. 23) of the insulating layer 2C and a wiring 4W is formed on the lower surface (downside in FIG. 23) of the insulating layer 2C. The wirings 3W and 4W are coupled to through-hole wirings 2TW. In description of this embodiment, it is assumed that the wiring substrate 2 has an insulating layer 2C as a core material. However, the wiring substrate may be a so-called coreless substrate which has no insulating layer 2C and only includes insulating layers IL12 to IL56.

Figure 24:
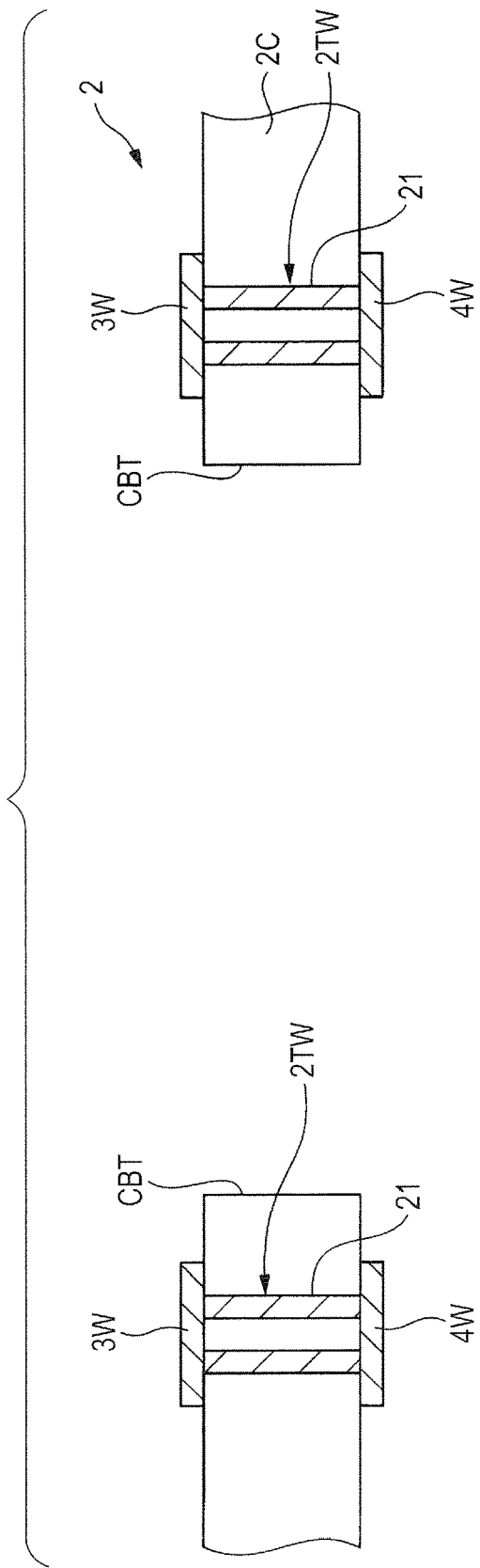
FIG. 24 is a sectional view showing a step in the process for manufacturing a wiring substrate.

Next, the step of "making openings CBT" (Step S12) shown in FIG. 22 is carried out. As shown in FIG. 24, an opening CBT is made in the insulating layer 2C.

Figure 25:
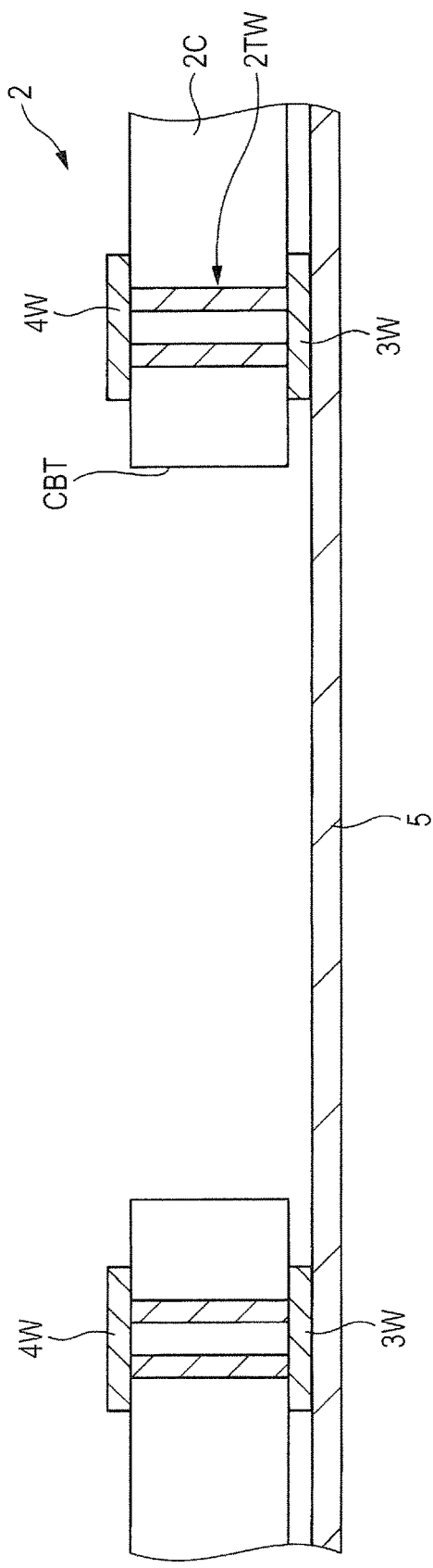
FIG. 25 is a sectional view showing a step in the process for manufacturing a wiring substrate.

Next, the step of "pasting a support member 5" (Step S13) shown in FIG. 22 is carried out. As shown in FIG. 25, the insulating layer 2C with openings CBT is pasted over the support member 5. At this time, the upper surface (downside in FIG. 25) of the insulating layer 2C is pasted on the support member 5 in a manner that the wirings 3W contact the support member 5. At this step, the use of an adhesive agent or the like for pasting work is not essential and they may be mechanically fixed to each other.

Figure 26:
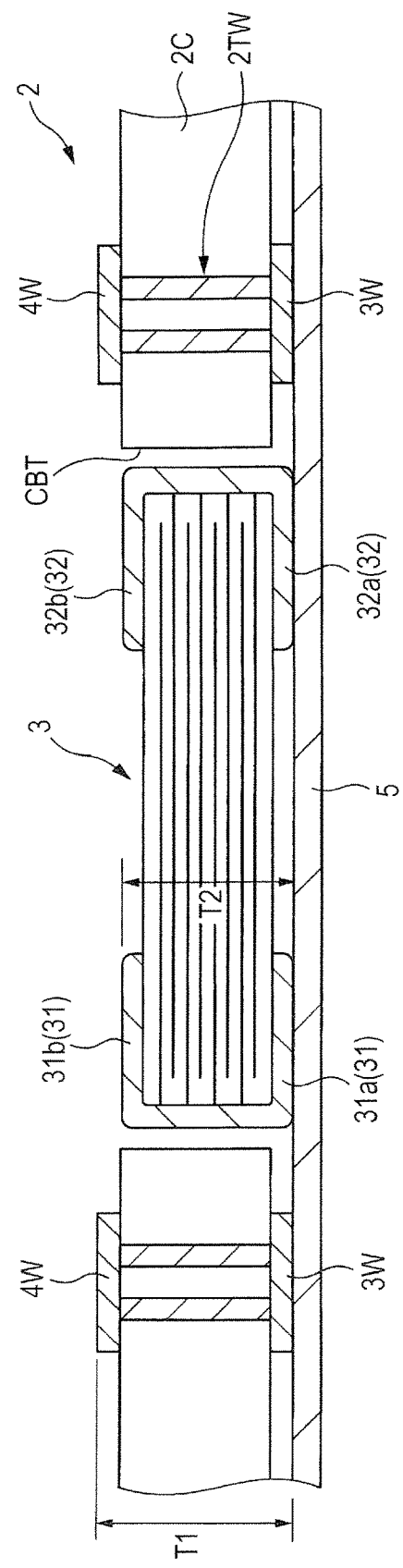
FIG. 26 is a sectional view showing a step in the process for manufacturing a wiring substrate.

Next, the step of "mounting a condenser 3" (Step S14) shown in FIG. 22 is carried out. As shown in FIG. 26, a chip condenser 3 is mounted in the opening CBT of the insulating layer 2C. It is mounted in a manner that the upper electrodes 31a and 32a of the chip condenser 3 contact the support member 5. Also, it is important that total thickness T1 of the insulating layer 2C and wirings 3W and 4W should be larger than thickness T2 of the chip condenser 3 including the upper electrode 31a and lower electrode 31b. When this relation (T1>T2) holds, breakdown of the chip condenser 3 can be prevented. The reason is that if the chip condenser 3 protrudes from the insulating layer 2C, pressure is locally applied to the chip condenser 3 when insulating layers IL45 and IL23, which will be stated later, are pasted and then subjected to heat treatment under pressure. Furthermore, it is important that the wirings 3W should be equal to the upper electrodes 31a and 32a in height. This brings the chip condenser 3 close to the main surface 2a of the wiring substrate 2, thereby improving the flatness of the main surface 2a of the wiring substrate 2.

Figure 27:
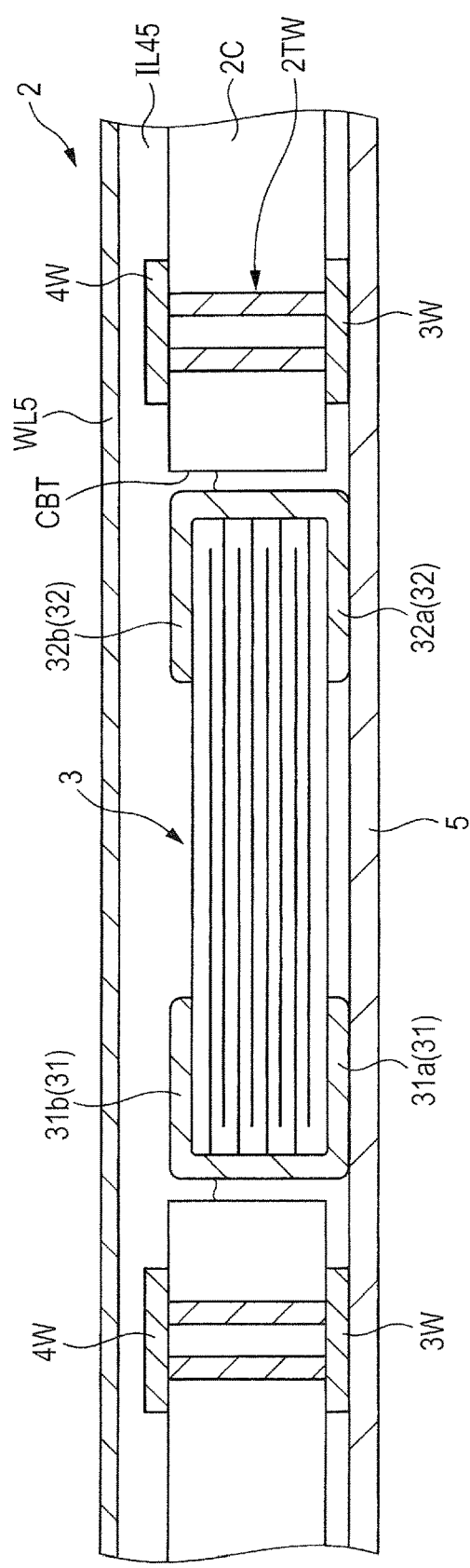
FIG. 27 is a sectional view showing a step in the process for manufacturing a wiring substrate.

Next, the step of "forming an insulating layer IL45" (Step S15) and the step of "peeling the support member 5" (Step S16) shown in FIG. 22 are carried out. As shown in FIG. 27, an insulating layer IL45 is formed so as to cover the chip condenser 3, insulating layer 2C, and wiring 4W. For example, it is desirable to take the following procedure: the inside of the opening CBT is coated with paste epoxy resin, then the solvent is evaporated to harden the resin, epoxy resin film is laminated over the wiring 4W, and then it is thermally hardened under pressure to form the insulating layer IL45; and a wiring layer WL5 is formed over it and the support member 5 is peeled off from the insulating layer 2C. This is because the wiring layer WL5 must be flattened in order to increase the pattern accuracy of the wiring layer WL5. For this reason, it is important to coat the inside of the opening CBT with paste epoxy resin and then evaporate the solvent to harden the resin.

The wiring 4W surrounds the chip condenser 3 and the opening CBT and thus functions as a dam to prevent the paste epoxy resin from flowing out horizontally.

Alternatively, only film epoxy resin may be used to bury the chip condenser 3 and fill the opening CBT. In that case, the opening CBT is filled with epoxy resin by laminating sheet epoxy resin over the wiring 4W and performing thermal hardening under pressure, and at the same time an insulating layer IL45 is formed and a wiring layer WL5 is formed over it before peeling off the support member 5 from the insulating layer 2C.

In the case of using only film epoxy resin, the opening CBT is filled with resin by film epoxy resin flowing into the opening CBT from around the opening CBT. Therefore, if the interval between buried chip condensers 3 is small, the flatness of the wiring layer WL5 would somewhat deteriorate because of resin inflow into the opening CBT. Therefore, if only film epoxy resin is used to fill the opening CBT, the density of buried chip condensers 3 would decrease. Generally, the interval between buried chip condensers 3 must be about 500 μm or more.

Although the density of chip condensers 3 which are buried is thus limited, this procedure eliminates the need for the steps of coating the inside of the opening CBT with paste epoxy resin and evaporating the solvent to harden the resin, so the processing cost is reduced.

Figure 28:
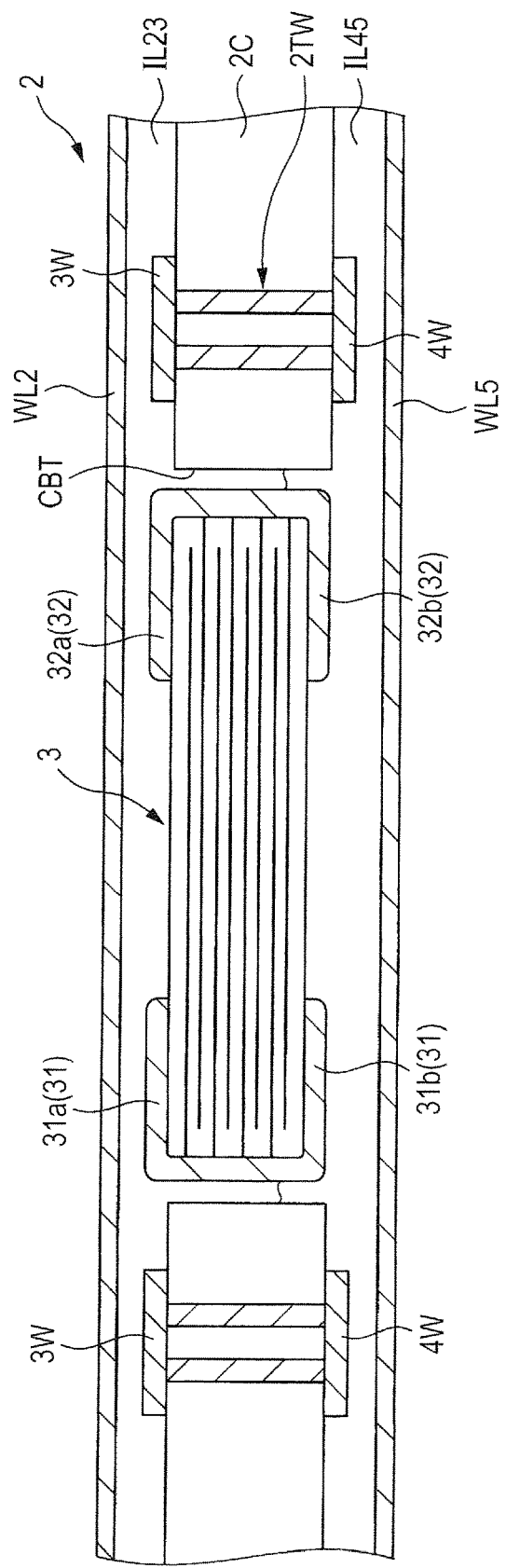
FIG. 28 is a sectional view showing a step in the process for manufacturing a wiring substrate.

Next, the step of "forming an insulating layer IL23" (Step S17) shown in FIG. 22 is carried out. As shown in FIG. 28, an insulating layer IL23 is formed so as to cover the chip condenser 3, insulating layer 2C, and wiring 3W. For example, the insulating layer IL23 is formed by laminating film epoxy resin and performing thermal hardening under pressure, and a wiring layer WL2 is formed over it. At this time, resin is additionally filled in an area where resin is not filled adequately at Step S15 shown in FIG. 22. At Step S15, in some cases, a gap is generated between the support member 5 and the chip condenser 3 or the insulating layer 2C as shown in FIG. 27, but at Step S17, resin is laminated on the side opposite to the lamination shown in FIG. 27 to fill such gap, thereby leading to improvement in quality.

If the thickness of the insulating layer IL23 over the chip condenser 3 and the opening CBT is smaller than over the other areas, the main surface 2a of the wiring substrate 2 would be uneven and a problem might arise, for example, at an inspection step. Specifically, the wiring 1W formed above the chip condenser 3 and the wiring 1W formed above another area (namely, above the insulating layer 2C around the opening CBT) would be different in height, so it would be difficult to make the probe needle for inspection contact the wirings 1W (terminals Vd21, Vs21, Tpd, and Tps, etc.) simultaneously. In addition, a problem would arise that high processing accuracy cannot be achieved in patterning the wiring layers WL1 and WL2 by a photolithographic technique and an etching technique. Next, a wiring layer WL5 is formed over the insulating layer IL45.

The insulating layers IL12, IL23, IL45, and IL56 may also be made of prepreg as resin-impregnated glass fiber. If the upper and lower surfaces of the insulating layer 2C containing the chip condenser 3 are insulating layers IL23 and IL45 made of prepreg, for example, disconnection of the wirings 1W, 2W, 5W, and 6W shown in FIG. 5 is prevented. Specifically, since the insulating layer 2C has many openings CBT in order to contain many chip condensers 3, stress generated by expansion or shrinkage of the wiring substrate 2 due to thermal fluctuation can be reduced by the insulating layers IL23 and IL45 made of prepreg as resin-impregnated glass fiber on the upper and lower surfaces of the insulating layer 2C.

Next, the step of "forming wiring layers WL1, WL2, WL5, and WL6" (Step S18) and the step of "exposing terminals" (Step S19) shown in FIG. 22 are carried out. Wirings 2W and 5W are formed as shown in FIG. 29 by processing the wiring layers WL2 and WL5 shown in FIG. 28. Though not shown in FIGS. 27 and 28, via electrodes V45 and V23 are formed in the insulating layers IL45 and IL23 before forming the wiring layers WL5 and WL2. Furthermore, as shown in FIG. 29, insulating layers IL12 and IL56 are formed and via electrodes V12 and V56 and wiring layers WL1 and WL6 are formed. The insulating layers IL12 and IL56 may be made of prepreg.

Furthermore, insulating layers SR1 and SR2 are formed so as to cover the wirings 1W and 6W and make openings H1 and H2 which partially expose the wirings 1W and 6W. The openings H1 and H2 are circular in plan view. As shown in FIG. 29, the diameter (width) W1 of an opening H1 is smaller than the diameter (width) W2 of an opening H2 (W1<W2). However, the openings H1 and H2 need not be circular.

Furthermore, as shown in FIG. 29, total thickness T1 of the insulating layer 2C and wirings 3W and 4W is larger than thickness T2 of the chip condenser 3 including the upper electrode 31a and lower electrode 31b. For example, the upper surface of the wiring 3W is the same as the upper surfaces of the upper electrodes 31a and 32a in height from the lower surface of the wiring 4W. Therefore, difference d between the total thickness T1 of the insulating layer 2C and wirings 3W and 4W and the thickness T2 of the chip condenser 3 including the upper electrode 31a and lower electrode 31b is equivalent to the height of the lower surface of the lower electrode 31b from the lower surface of the wiring 4W. Here, "upper surface" means an surface on an upper side in FIG. 29 (namely, a surface nearer to the side where a semiconductor chip is mounted) and "lower surface" means a surface on a lower side (surface nearer to the side where solder balls are coupled).

Variation 1

The invention made by the present inventors has been so far explained concretely in reference to the preferred embodiment thereof. However, the invention is not limited thereto and it is obvious that these details may be modified in various ways without departing from the gist thereof.

In the above embodiment, as shown in FIG. 5, the terminals Tpd and Tps to check for disconnection in the chip condenser 3 are located on the side of the main surface 2a of the wiring substrate 2 (namely, nearer to the side where the semiconductor chip 1 is mounted). In Variation 1, terminals Tpd1 and Tps1 are added on the side of the back surface 2b of the wiring substrate 2 to check for disconnection in the chip condenser 3.

Figure 30:
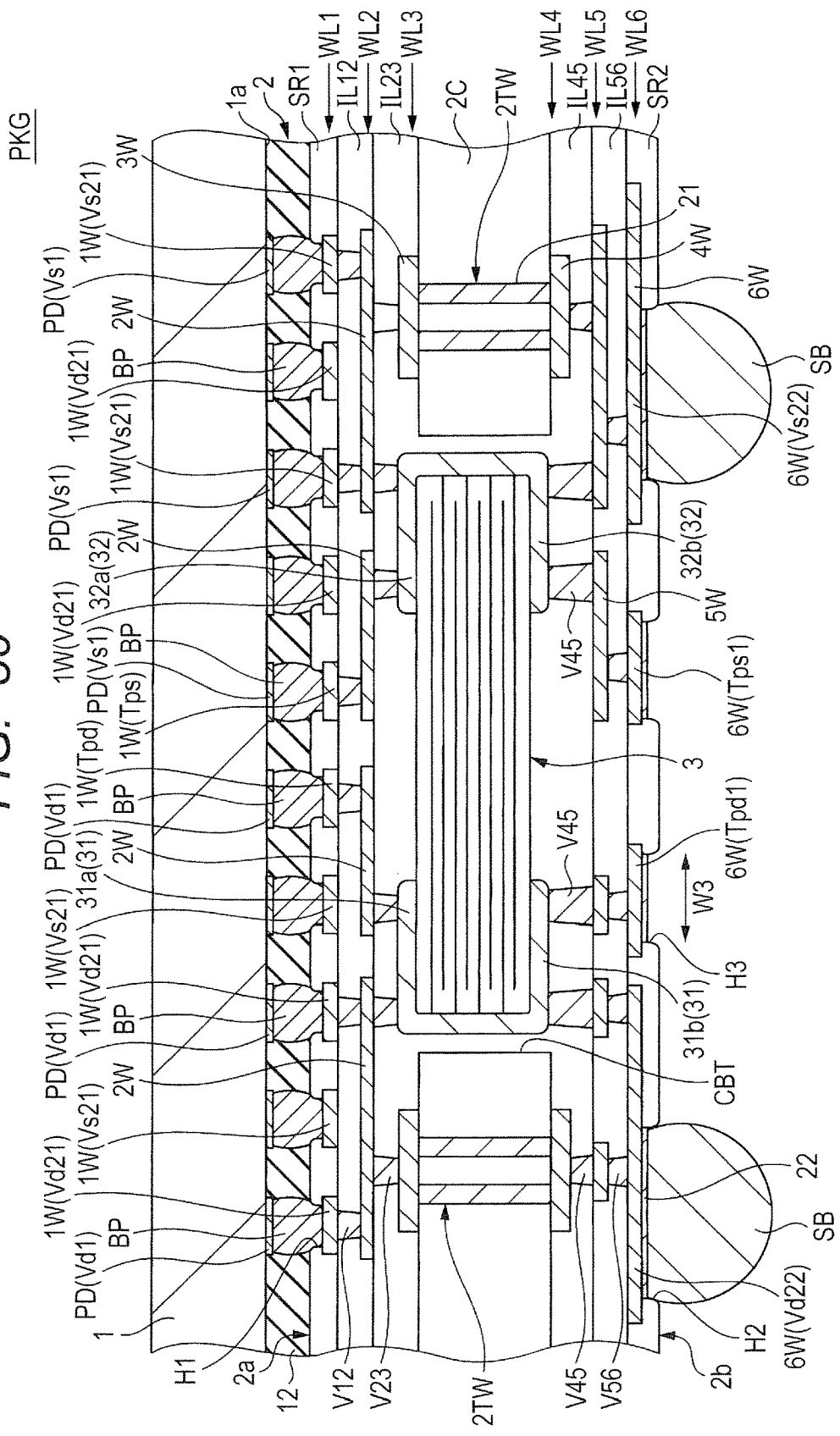
FIG. 30 is a sectional view of a semiconductor device according to Variation 1.

FIG. 30 is a sectional view of the semiconductor device according to Variation 1. As shown in FIG. 30, two via electrodes V45 are coupled to the lower electrode 31b of the chip condenser 3; and one of the via electrodes V45 is coupled to the terminal Vd22 and the other via electrode V45 is coupled to the terminal Tpd1. In the semiconductor device manufacturing process explained earlier referring to FIG. 8, coupling of the chip condenser 3 to the wiring for supply voltage can be checked by conducting a test of continuity between the terminals Vd22 and Tpd1 shown in FIG. 30 after the step of "forming solder balls" (Step S5). In other words, if continuity between the terminals Vd22 and Tpd1 is confirmed, it implies that the power supply wiring is coupled to at least either the upper electrode 31b or the upper electrode 31a.

A terminal Tps1 is also provided on the lower electrode 32b of the other electrode 32 of the chip condenser 3 in the same way as above. Therefore, coupling of the chip condenser 3 to the wiring for grounding potential can be confirmed.

The terminals Tpd1 and Tps1 are exposed from the openings H3 made in the insulating layer SR2. Each opening H3 is circular and its diameter (width) W3 is smaller than the diameter (width) W2 of the opening H2 shown in FIG. 29 (W3<W2). Since no bump electrode is formed in the opening H3, its diameter (width) W3 can be smaller than the diameter (width) W1 of the opening H1 (W3<W1).

Variation 2

Figure 31:
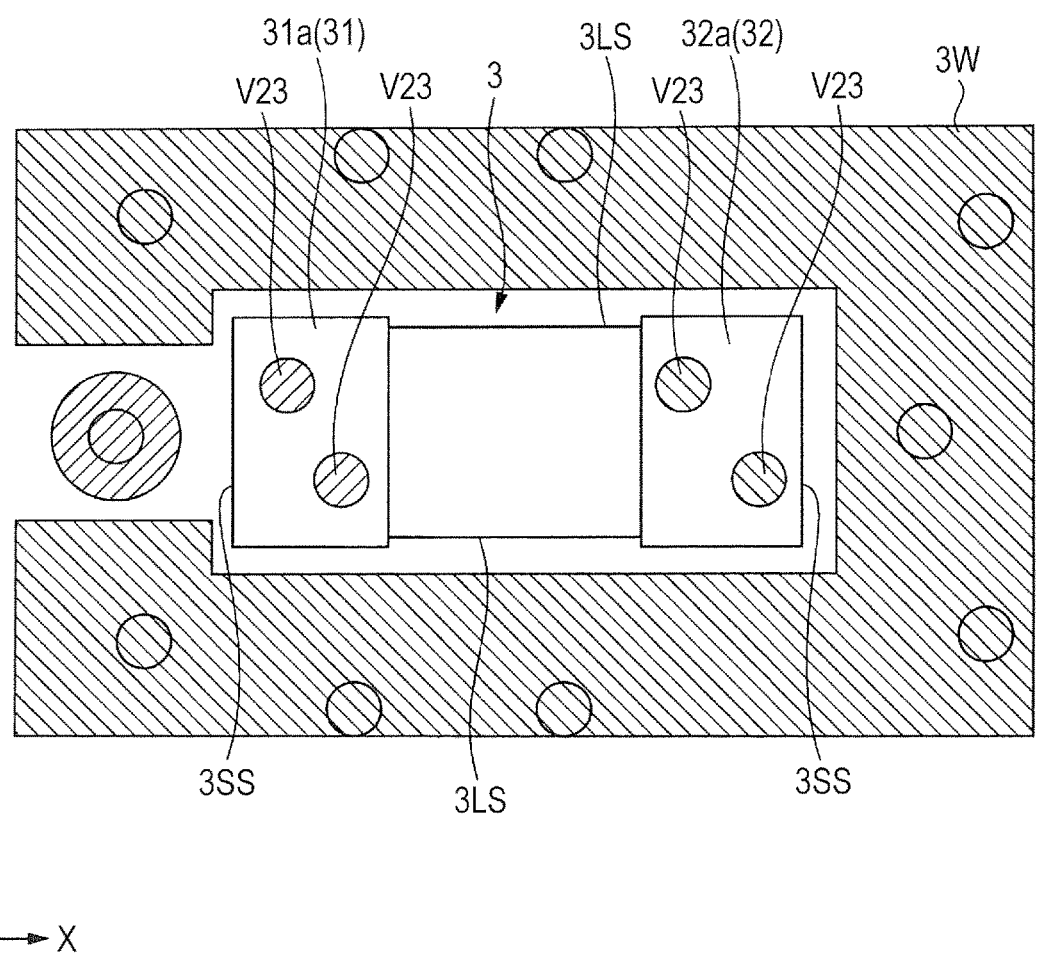
FIG. 31 shows the layout of a wiring layer of a wiring substrate according to Variation 2.

Variation 2 is different from the above embodiment in the layout shown in FIG. 12. FIG. 31 shows the layout of a wiring layer of the wiring substrate according to Variation 2. As shown in FIG. 31, two via electrodes V23 are coupled to the upper electrode 31a of the chip condenser 3. The two via electrodes V23 are obliquely arranged with respect to the X direction (direction in which the long sides 3LS of the chip condenser extend). Specifically, the two via electrodes V23 are arranged along the X direction (direction in which the long sides 3LS of the chip condenser 3 extend) and one via electrode V23 is nearer to one long side 3LS and the other via electrode V23 is nearer to the other long side 3LS.

Due to the oblique arrangement of the two via electrodes V23, the width of the electrode 31 in the X direction can be smaller than when the two via electrodes V23 are arranged side by side along the X direction. In addition, the diameter of the via electrode V23 can be increased.

Variation 3

Variation 3 is an example of the chip condenser 1 according to the above first embodiment which is mounted over an electronic device. FIG. 32 is a sectional view of the electronic device according to Variation 3.

As shown in FIG. 32, the electronic device EVD includes a mother board MB, a wiring substrate IP coupled to the mother board MB through solder balls SB, and semiconductor chips 1X and 1Y coupled to the wiring substrate IP through bump electrodes BP.

Three chip condensers 3X1, 3X2, and 3X3 are built in the wiring substrate IP. Though not shown in the figure, the three chip condensers 3X1, 3X2, and 3X3 are coupled between the wirings for supply voltage and the wirings for reference voltage in the same way as in the first embodiment. The chip condenser 3X1 is located under the semiconductor chip 1X and the chip condenser 3X3 is located under the semiconductor chip 1Y. The chip condenser 3X2 is located in an area where it does not overlap the semiconductor chips 1X and 1Y, for example, in an area between the semiconductor chips 1X and 1Y.

In addition, the mother board MB also contains a chip condenser 3Y which is coupled between the supply voltage wiring and reference voltage wiring of the mother board MB.

Terminals Tpd and Tps to check the coupling of the chip condenser are coupled to the chip condensers 3X1, 3X2, 3X3, and 3Y in the same way as in the above embodiment as described referring to FIG. 5.

Some of the features of the above embodiment are described below.

Note 1

A semiconductor device manufacturing method including the steps of:

(a) providing a wiring substrate which has: a first surface; a second surface opposite to the first surface; a chip condenser built in between the first surface and the second surface, having a first electrode and a second electrode; a first terminal and a second terminal disposed on the first surface; a third terminal disposed on the second surface; a first conduction path for coupling the first terminal and the third terminal; a second conduction path for coupling the first terminal and the first electrode; a third conduction path for coupling the third terminal and the first electrode; and a fourth conduction path for coupling the second terminal and the first electrode;

(b) conducting a test of continuity between the second terminal and the first terminal or between the second terminal and the third terminal; and (c) mounting a semiconductor chip with a first chip electrode and a second chip electrode over the first surface and forming a first bump electrode for coupling the first terminal and the first chip electrode and a second bump electrode for coupling the second terminal and the second chip electrode.

Note 2

The semiconductor device manufacturing method described in Note 1, further including the step of:

(d) covering the peripheries of the first bump electrode and the second bump electrode and filling an insulating layer between the first surface and the semiconductor chip.

Note 3

A wiring substrate manufacturing method including the steps of:

(a) providing a first insulating layer having a first surface, a second surface opposite to the first surface, a first wiring formed on the first surface, a second wiring formed on the second surface, and a through hole penetrating from the first surface to the second surface;

(b) placing the first insulating layer over a support member in a manner that the main surface of the support member contacts the first wiring;

(c) providing a chip condenser having a third surface, a fourth surface opposite to the third surface, a first electrode formed on the third surface, and a second electrode formed on the fourth surface;

(d) inserting the chip condenser into the through hole in a manner that the first electrode on the third surface contacts the main surface of the support member;

(e) forming a second insulating layer for covering the second surface of the first insulating layer and the fourth surface of the chip condenser;

(f) removing the support member and forming a third insulating layer for covering the first surface of the first insulating layer and the third surface of the chip condenser; and (g) forming a plurality of third wirings over the third insulating layer.

Note 4

The wiring substrate manufacturing method described in Note 3, in which the thickness of the first insulating layer including the first wiring and the second wiring is larger than the thickness of the chip condenser including the first electrode and the second electrode.

Note 5

The wiring substrate manufacturing method described in Note 3, in which the through hole is a rectangle with four sides in plan view, and the second wiring has a shape which surrounds the through hole along three sides of the through hole.

Note 6

The wiring substrate manufacturing method described in Note 5, in which the first wiring has a shape which surrounds the through hole along the three sides of the through hole.

Note 7

The wiring substrate manufacturing method described in Note 6, in which the main surface of the first insulating layer is exposed between the first wiring and the through hole.

What is claimed is:

1. A semiconductor device comprising:
   a wiring substrate having a first surface and a second surface opposite to the first surface;
   a semiconductor chip having a first chip electrode and a second chip electrode and being mounted over the wiring substrate;
   a chip condenser built in the wiring substrate, having a first electrode and a second electrode;
   a first terminal and a second terminal disposed on the first surface;
   a third terminal disposed on the second surface;
   a first conduction path for coupling the first terminal and the third terminal;
   a second conduction path for coupling the first terminal and the first electrode including a first via electrode coupled to the first electrode;
   a third conduction path for coupling the third terminal and the first electrode; and
   a fourth conduction path for coupling the second terminal and the first electrode including a second via electrode coupled to the first electrode,
   wherein the fourth conduction path is coupled to the first electrode electrically independently from the first conduction path, the second conduction path, and the third conduction path, and
   wherein in plan view, the chip condenser has a rectangular shape having a first long side, a second long side, a first short side, and a second short side and the first electrode is formed along the first short side.

2. The semiconductor device according to claim 1, wherein the first via electrode and the second via electrode are arranged in parallel to the first long side in plan view.

3. The semiconductor device according to claim 1, wherein in plan view, the first via electrode and the second via electrode are arranged along the first long side and the first via electrode is nearer to the first long side than the second via electrode and the second via electrode is nearer to the second long side than the first via electrode.

4. The semiconductor device according to claim 1, further comprising:
   a first bump electrode for coupling the first terminal and the first chip electrode; and
   a second bump electrode for coupling the second terminal and the second chip electrode.

5. The semiconductor device according to claim 4, further comprising:
   a first insulating layer covering peripheries of the first bump electrode and the second bump electrode and filling between the first surface of the wiring surface and the semiconductor chip.

6. The semiconductor device according to claim 1, further comprising:
   a fourth terminal disposed on the second surface; and
   a fifth conduction path for coupling the fourth terminal and the first electrode.

7. The semiconductor device according to claim 6, further comprising:
   a second insulating layer covering the second surface and having a first opening exposing the third terminal and a second opening exposing the fourth terminal,
   wherein diameter of the second opening is smaller than diameter of the first opening.

8. The semiconductor device according to claim 1, further comprising:
   a third insulating layer covering the first surface and having a third opening exposing the first terminal, and a fourth opening exposing the second terminal,
   wherein diameter of the third opening is equal to diameter of the fourth opening.

9. The semiconductor device according to claim 1, the wiring substrate further comprising:
   a fourth insulating layer having a third surface, a fourth surface opposite to the third surface, a first through hole, and a second through hole penetrating from the third surface to the fourth surface;
   a first wiring covering the second through hole and being formed on the third surface;
   a second wiring covering the second through hole and being formed on the fourth surface; and
   a through-hole wiring being formed in the second through hole and coupled to the first wiring and the second wiring,
   wherein the chip condenser has an upper surface and a lower surface opposite to the upper surface,
   wherein the first electrode includes an upper electrode formed on the upper surface and a lower electrode formed on the lower surface, and
   wherein in sectional view, thickness of the chip condenser including the upper electrode and the lower electrode is smaller than thickness of the fourth insulating layer including the first wiring and the second wiring.

10. The semiconductor device according to claim 9, further comprising:
a fifth insulating layer covering the first wiring and the upper electrode,
wherein the fourth insulating layer and the fifth insulating layer are resin layers containing glass fiber.

11. The semiconductor device according to claim 10, further comprising:
a third wiring formed over the fifth insulating layer; and
a sixth insulating layer covering the third wiring,
wherein the sixth insulating layer is made of epoxy resin.

12. A semiconductor device comprising:
a wiring substrate having a first surface and a second surface opposite to the first surface;
a semiconductor chip having a first chip electrode and a second chip electrode and being mounted over the wiring substrate;
a chip condenser built in the wiring substrate, having a first electrode and a second electrode;
a first terminal, a second terminal, a third terminal, and a fourth terminal disposed on the first surface;
a fifth terminal and a sixth terminal disposed on the second surface;
a first conduction path for coupling the first terminal and the fifth terminal;
a second conduction path for coupling the first terminal and the first electrode;
a third conduction path for coupling the fifth terminal and the first electrode; and
a fourth conduction path for coupling the second terminal and the first electrode;
a fifth conduction path for coupling the third terminal and the sixth terminal;
a sixth conduction path for coupling the third terminal and the second electrode;
a seventh conduction path for coupling the sixth terminal and the second electrode; and
an eighth conduction path for coupling the fourth terminal and the second electrode,
wherein the fourth conduction path is coupled to the first electrode independently from the first conduction path, the second conduction path, and the third conduction path, and
wherein the eighth conduction path is coupled to the second electrode independently from the fifth conduction path, the sixth conduction path, and the seventh conduction path.

13. The semiconductor device according to claim 12, further comprising:
a first bump electrode for coupling the second terminal and the first chip electrode; and
a second bump electrode for coupling the fourth terminal and the second chip electrode.

14. The semiconductor device according to claim 13, wherein the first bump electrode and the second bump electrode are located adjacent to each other without another bump electrode between them.

15. The semiconductor device according to claim 14, further comprising:
a first solder ball electrode coupled to the fifth terminal; and
a second solder ball electrode coupled to the sixth terminal.

16. The semiconductor device according to claim 12, further comprising:
a first conductive plate coupled to the fourth conduction path;
a second conductive plate coupled to the eighth conduction path; and
an insulating film located between the first conductive plate and the second conductive plate,
wherein the first conductive plate and the second conductive plate have a region where they overlap each other in plan view.

17. A semiconductor device comprising:
a wiring substrate having a first front surface where a plurality of first external electrodes are formed and a first back surface opposite to the first front surface, where a plurality of second external electrodes are formed; and
a semiconductor chip having a main surface and being mounted over the first front surface in a manner that the first front surface of the wiring substrate faces the main surface,
the wiring substrate comprising:
a core substrate having, between the first front surface and the first back surface, a second front surface facing the first front surface and a second back surface being opposite to the second front surface and facing the first back surface;
a first condenser having, between the second front surface and the second back surface of the core substrate, a first surface facing the first front surface and a second surface being opposite to the first surface and facing the first back surface; and
a plurality of wirings,
wherein the first external electrodes include a first electrode and a second electrode,
wherein the second external electrodes include a third electrode,
wherein the first condenser has a plurality of electrodes,
wherein the wirings include a first wiring, a second wiring, a third wiring, and a fourth wiring,
wherein one end of the first wiring is electrically coupled to the first electrode on the first front surface,
wherein another end of the first wiring is electrically coupled to the third electrode on the first back surface,
wherein one end of the second wiring is electrically coupled to the first electrode on the first front surface,
wherein another end of the second wiring is electrically coupled to a fourth electrode included in the electrodes of the first condenser,
wherein one end of the third wiring is electrically coupled to the second electrode on the first front surface,
wherein another end of the third wiring is electrically coupled to the fourth electrode of the first condenser,
wherein one end of the fourth wiring is electrically coupled to the third electrode on the first back surface,
wherein another end of the fourth wiring is electrically coupled to the fourth electrode of the first condenser,
wherein the second wiring and the third wiring are electrically coupled through the fourth electrode, and
wherein the third wiring and the fourth wiring are electrically coupled through the fourth electrode.

18. The semiconductor device according to claim 17, wherein length from the first surface of the first condenser to the first front surface of the wiring substrate is equal to length from the second front surface of the core substrate to the first front surface of the wiring substrate.

19. The semiconductor device according to claim 17, wherein the fourth electrode of the first condenser has a plurality of vias, wherein the other end of the second wiring is electrically coupled to the fourth electrode of the first condenser through a first via included in the vias, wherein the other end of the third wiring is electrically coupled to the fourth electrode of the first condenser through a second via included in the vias, wherein in plan view, the fourth electrode has a first side, a second side extending along the first side, and a third side crossing the first side and the second side, wherein in plan view, the first via is disposed along the first side, wherein in plan view, the second via is disposed along the second side, and wherein in plan view, the first via is nearer to the first side than the second via and nearer to the third side than the second via.

20. The semiconductor device according to claim 17, wherein the first back surface of the wiring substrate has a fifth electrode included in the second external electrodes, wherein a second condenser having a plurality of electrodes is located between the second front surface and the second back surface of the core substrate, wherein the first condenser further has a sixth electrode included in the electrodes, wherein the second condenser has a seventh electrode and an eighth electrode which are included in the electrodes, wherein the wirings further include a fifth wiring, a sixth wiring, and a seventh wiring, wherein one end of the fifth wiring is electrically coupled to the sixth electrode on the first condenser, wherein another end of the fifth wiring is electrically coupled to the fifth electrode on the first back surface, wherein one end of the sixth wiring is electrically coupled to the first electrode on the first front surface, wherein another end of the sixth wiring is electrically coupled to the seventh electrode of the second condenser, wherein one end of the seventh wiring is electrically coupled to the eighth electrode of the second condenser, wherein another end of the seventh wiring is electrically coupled to the fifth electrode on the first back surface, and wherein capacity of the first condenser is smaller than capacity of the second condenser.

21. The semiconductor device according to claim 19, wherein the wiring substrate has a third via located adjacent to the first via through the first side.

* * * * *